United States Patent
Tsuchi

(10) Patent No.: US 7,880,651 B2
(45) Date of Patent: Feb. 1, 2011

(54) SAMPLE AND HOLD CIRCUIT AND DIGITAL-TO-ANALOG CONVERTER CIRCUIT

(75) Inventor: Hiroshi Tsuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 7 days.

(21) Appl. No.: 12/458,594

(22) Filed: Jul. 16, 2009

(65) Prior Publication Data

US 2010/0013686 A1 Jan. 21, 2010

(30) Foreign Application Priority Data

Jul. 17, 2008 (JP) ............... 2008-186258

(51) Int. Cl.
*H03M 1/00* (2006.01)
(52) U.S. Cl. .................. 341/122; 341/155; 341/172
(58) Field of Classification Search .................. 341/155, 341/172, 122
See application file for complete search history.

(56) References Cited

U.S. PATENT DOCUMENTS 6,753,801 B2 * 6/2004 Rossi ..................... 341/161
7,598,896 B2 * 10/2009 Kawahito ................ 341/162
2010/0066581 A1 * 3/2010 Ito ........................ 341/158

FOREIGN PATENT DOCUMENTS

JP 59-154820 9/1984

* cited by examiner

*Primary Examiner*—Peguy JeanPierre
(74) *Attorney, Agent, or Firm*—McGinn IP Law Group, PLLC

(57) ABSTRACT

Disclosed is a sample and hold circuit including a differential circuit, an amplifier stage and a sampling voltage supply circuit. The differential circuit includes first and second capacitance elements, electric charge of which is distributed by a first switch, a first MOS transistor having a gate connected via a second switch to one end of the first capacitance element and also connected via a third switch to an output terminal, and having a source connected to a first current source, a second MOS transistor having a gate connected to one end of the second capacitance element and having a source connected to a second current source and also connected via a forth switch to the source of the first MOS transistor, and a load circuit connected between the drains of the first and second MOS transistors and a terminal of a second power supply. The amplifier stage receives an output of the differential circuit and has an output connected to the output terminal. The sampling voltage supply circuit delivers a sampling voltage to the one end of at least one of the first and second capacitance elements.

20 Claims, 16 Drawing Sheets

REFERENCE CASE

US 7,880,651 B2

SAMPLE AND HOLD CIRCUIT AND DIGITAL-TO-ANALOG CONVERTER CIRCUIT

REFERENCE TO RELATED APPLICATION

This application is based upon and claims the benefit of the priority of Japanese patent application No. 2008-186258, filed on Jul. 17, 2008, the disclosure of which is incorporated herein in its entirety by reference thereto.

TECHNICAL FIELD

This invention relates to a sample and hold circuit and a digital-to-analog converter circuit.

BACKGROUND

Recently, a liquid crystal display (LCD), featured by thin thickness, light weight and low power consumption, has become popular as display, and has been in widespread use for a display unit of mobile equipment, such as portable telephone sets (mobile phone or cellular phone), PDA (Personal Digital Assistant) or a notebook personal computer. In these days, with progress in the technique for increasing the size of a viewing area of the liquid crystal display and for coping with moving pictures, the liquid crystal display is now usable not only for mobile application but also for a stationary large viewing area display or for a large viewing area liquid crystal television set. For these sorts of the liquid crystal display, a liquid crystal display of an active matrix driving scheme, capable of high definition representation, has come to be used.

Initially, a typical configuration of a liquid crystal display of the active matrix driving scheme is briefly described with reference to FIG. 15. In FIG. 15, certain principal components, connected to each pixel of a liquid crystal display unit, are schematically shown by equivalent circuits.

In general, a display unit 960 of a liquid crystal display of an active matrix driving scheme includes a semiconductor substrate, an opposite substrate, including a transparent electrode 967 that covers the entire surface of the opposite substrate, and a liquid crystal. The semiconductor substrate includes a matrix array of larger numbers of transparent pixel electrodes 964 and larger numbers of thin-film transistors (TFTs) 963. In the case of a color SXGA panel, for example, 1280×3 pixel columns by 1024 pixel rows make up the matrix array. The liquid crystal is sealed in-between the semiconductor substrate and the opposite substrate that are arranged facing each other. The liquid crystal is capacitive and forms a capacitor 965 in-between the pixel electrode 964 and the electrode 967. There may further be provided an auxiliary capacitor 966 for assisting in the capacitive performance of the liquid crystal.

With the above-described liquid crystal display, the TFT 963, having the switching function, is controlled to be on or off by a scanning signal. When the TFT 963 is turned on, the gray level signal voltage of a picture data signal is applied to the pixel electrode 964. The potential difference between the pixel electrodes 964 and the electrode 967 of the opposite substrate causes the transmittance of the liquid crystal to be changed. This potential difference is retained for a preset time by a capacitance 965 and an auxiliary capacitance 966, even after the TFT 963 has been turned off, thereby displaying a picture.

On the semiconductor substrate, larger numbers of data lines 962 for transmitting a plurality of level voltages (gray level signal voltages) to be applied to the pixel electrodes 964 and larger numbers of the scanning lines 961 for transmitting scanning signals are arrayed in a lattice. With the aforementioned color SXGA panel, there are provided 1280×3 data lines and 1024 scanning lines. The scanning lines 961 and the data lines 962 represent marked capacitive loads because of capacitances generated at the intersections and capacitance of the liquid crystal sandwiched in-between the two substrates.

It is observed that the scanning signal is supplied by a gate driver 970 to the scanning lines 961, while the gray level signal voltage is supplied to each pixel electrode 964 by a data driver 980 via the data lines 962. The gate driver 970 and the date driver 980 are controlled by a display controller 950, which display controller 950 delivers a clock CLK or a control signal as necessary. Picture data are delivered to the data driver 980. At the present time, digital data represent mainstream picture data. Power supply voltages are supplied to the gate driver 970 and the date driver 980 from a power circuit 940.

Picture data for a complete picture image is rewritten within one frame period or usually within 1/60 second. For reproducing moving pictures, the frame period may sometimes be 1/120 sec. The picture data is sequentially selected by each scanning line every pixel row or every horizontal line. The gray level signal voltage is supplied from each data line during the time of the selection.

Meanwhile, it is sufficient for the gate driver 970 to supply a scanning signal with at least two values. On the other hand, the data driver 980 has to drive the data lines with a gray level signal voltage of multiple levels corresponding to the number of gray levels. Thus, the data driver 980 is provided with a digital-to-analog converter circuit including a digital-to-analog converter (DAC) that converts picture data into gray level signal voltages and an amplifier circuit that amplifies the gray level voltages to output the so amplified gray level voltages at the data lines 962.

In recent liquid crystal displays, a higher picture quality with more and more colors has become a preference, such that there is raised a demand for at least 260,000 colors (for picture data with 6 bits each of R, G and B) and even 26,800,000 colors (for picture data with 8 bits each of R, G and B). Hence, with a data driver that outputs the gray level signal voltages to cope with multi-bit picture data, the DAC circuit size increases with resulting increase in the chip size of the data driver LSI, thus raising the cost. To keep pace with increase in the size of a viewing area of the liquid crystal display, higher resolution is also needed to further increase the load capacitance on the data lines 962, while the one-data selection time interval (one data outputting time interval) roughly corresponding to the one frame time interval divided by the number of the gate lines is becoming shorter. For this reason, it is up to the amplifier circuit, operating as an output buffer of the driver LSI, to drive a larger load at a high speed at high voltage accuracy during a shorter one-data selection time.

As an area-saving DAC that converts the multi-bit digital data to an analog voltage signal, there is known a serial DAC that sequentially samples a reference voltage in response to time-serially input digital data and repeats charge re-distribution between the capacitances to get a level voltage.

FIG. 16 depicts a schematic circuit diagram showing an example configuration of a digital-to-analog converter circuit provided with a serial DAC disclosed in Patent Document 1 as indicated hereinbelow.

The digital-to-analog converter circuit, shown in FIG. 16, includes voltage delivery nodes N5 and N6 to which are delivered reference voltages V5 and V6, respectively. The digital-to-analog converter circuit also includes a serial DAC provided with capacitance elements C91 and C92, a changeover switch 911, and switches 912 and 913, and a voltage follower circuit 919. The capacitance element C91 has a first terminal connected to the voltage delivery node N5, while having a second terminal connected to a node N51. The capacitance element C92 has a first terminal connected to the voltage delivery node N5, while having a second terminal connected to a node N52. The changeover switch 911 connects the node N51 to the voltage delivery node N5 or N6. The switch 912 is connected between the nodes N51 and N52, while the switch 913 is connected between the node N52 and the voltage delivery node N5. The voltage follower circuit 919 is made up of a differential amplifier having a non-inverting input end (+) connected to the node N52 and having an inverting input end (−) connected to an output terminal. The capacitance elements C91 and C92 are ordinarily set to equal capacitance values.

The operation of the serial DAC, shown in FIG. 16, is now described. Initially, the switch 913 is turned on for a moment to reset the potential difference (terminal-to-terminal voltage) across both ends (N5 and N52) of the capacitance element C92 to zero.

The reference voltage V5 or V6 is sampled at the node N51, by the changeover switch 911, in response to the value of the lowermost bit data $B_1$ out of time-serially input digital data $B_1$ to $B_k$. The switch 911 is then turned off, that is, opened. The switch 912 is turned on so that electric charge is re-distributed between the capacitance elements C91 and C92. The switch 912 is then turned off so that the electric charge are retained by the capacitance element C92.

Then, responsive to the next bit data B2, the reference voltage V5 or V6 is sampled by the node N51 by the switch 911. After re-distribution of the electric charge between the capacitance elements C91, C92 by the switch 912, the electric charge, thus re-distributed, are retained by the capacitance element C92.

By the similar sequence of operations, the sample and hold operations are reiterated in the direction from the low order bit data towards the high order bit data.

In the case of K-bit data, one cycle of sample and hold operations is repeated K times. After the end of the one cycle of the sample and hold operations, the voltage at the node N52 is represented by the following equation (1):

$$V_{N52}=(2^{-1}\times B_K+2^{-2}\times B_{K-1}+\ldots+2^{-K}\times B_1)\times(V6-V5)+V5 \qquad (1)$$

where $B_K, B_{K-1}, \ldots, B_1$ are 0 or 1.

A voltage $V_{N52}$ is amplified and output as an output voltage Vout by the voltage follower circuit 919. In this manner, the digital-to-analog converter circuit is able to output $2^K$ voltage levels corresponding to $2^K$ equal interval divisions of the voltage range between the reference voltages V5 and V6 in response to K-bit data.

With the digital-to-analog converter circuit, shown in FIG. 16, the number of devices is not dependent on the number of data bits, with the result that the circuit size may be significantly reduced even if the number of bits is increased, thus leading to saving in the circuit area.

With the digital-to-analog converter circuit of FIG. 16, the output voltage is a linear output resulting from division by equal intervals of each voltage range between respective voltage levels. However, with the digital-to-analog converter circuit which receives input digital data of large number of bits, it is possible to select and output gray scale voltages that are in keeping with non-linear gamma characteristic of the liquid crystal.

[Patent Document 1] JP Patent Kokai Publication No. JP-A-59-154820 (FIG. 1)

SUMMARY

The following is an analysis of the related art made from the side of the present invention.

With the serial digital-to-analog converter circuit, described above with reference to FIG. 16, charge re-distribution between the two capacitance elements (C91, C92) is repeated bit-by-bit a number of cycles corresponding to the number of bits. The resulting output is a linear voltage corresponding to the division of the voltage range between the two reference voltages (V5, V6) by equal intervals corresponding to the number of bits.

In these days, saving in circuit area is required of a digital-to-analog converter circuit used for a data driver that drives the data lines of a display.

A serial DAC is of a small circuit size. If, in the serial DAC of FIG. 16, the values of the capacitance elements C91 and C92, responsible for charge distribution, are reduced to cope with area saving of the DAC of FIG. 16, the input capacitances of an amplifier (voltage follower) 919, mainly its gate capacitances, affect the charge distribution across the capacitance elements C91 and C92, thus leading to output errors (analysis by the present inventor).

It is therefore an object of the present invention to provide a sample and hold circuit, in which an output error related with an input capacitance of an amplifier (gate capacitance) is only small even if the values of the capacitances responsible for charge distribution are small, thus assuring a highly accurate output. The present invention also envisages to provide a corresponding digital-to-analog converter circuit and a display provided with the digital-to-analog converter circuit.

To accomplish the above object, the invention disclosed in the present application may be summarized substantially as follows.

In one aspect of the present invention, there is provided a sample and hold circuit comprising first and second capacitance elements having one ends connected via a first switch and having the other ends connected in common to a node supplied with a reference voltage, and a differential circuit, in which the differential circuit includes a differential input stage having an input pair, and an amplifier stage. A first input of the input pair is connected via a second switch to the one end of the first capacitance element, and a second input of the input pair is connected to the one end of the second capacitance element. An input of the amplifier stage receives an output of the differential input stage. An output of the amplifier stage is connected to an output terminal of the sample and hold circuit and to the first input of the differential input stage via a third switch. The present invention also provides a corresponding digital-to-analog converter circuit and a display device provided with the digital-to-analog converter circuit.

According to the present invention, each data period has first, second and third time intervals. During the first time interval, the first and third switches are turned off and the second switch is turned on and to a voltage to be sampled is applied to the one end of at least one of the first and second capacitance elements. During the second time interval, the states of the second and third switches are kept unchanged from the states thereof that prevailed during the first time interval, while the first switch is turned on to re-distribute electric charge between the first and second capacitance elements. During the third time interval, the first and second switches are turned off and the third switch is turned on, whereby an output signal of the differential circuit that differentially amplifies the voltages of the first and second inputs is output at the output terminal.

According to the present invention, the differential input stage includes first and second transistors having first terminals connected via respective current sources to a terminal of a first power supply and having second terminals connected via load elements to a terminal of a second power supply. The control terminals of the first and second transistors constitute the first and second inputs of the differential input stage. There is provided a fourth switch between the first terminals of the first and second transistors.

With the sample and hold circuit or a serial DAC, according to the present invention, an output error related with an input capacitance of an amplifier (gate capacitance) is only small even if the values of the capacitances responsible for charge distribution are small, thus assuring a highly accurate output.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES OF THE INVENTION

Reference is now made to the accompanying drawings for further detailed description of the present invention.

Figure 1:
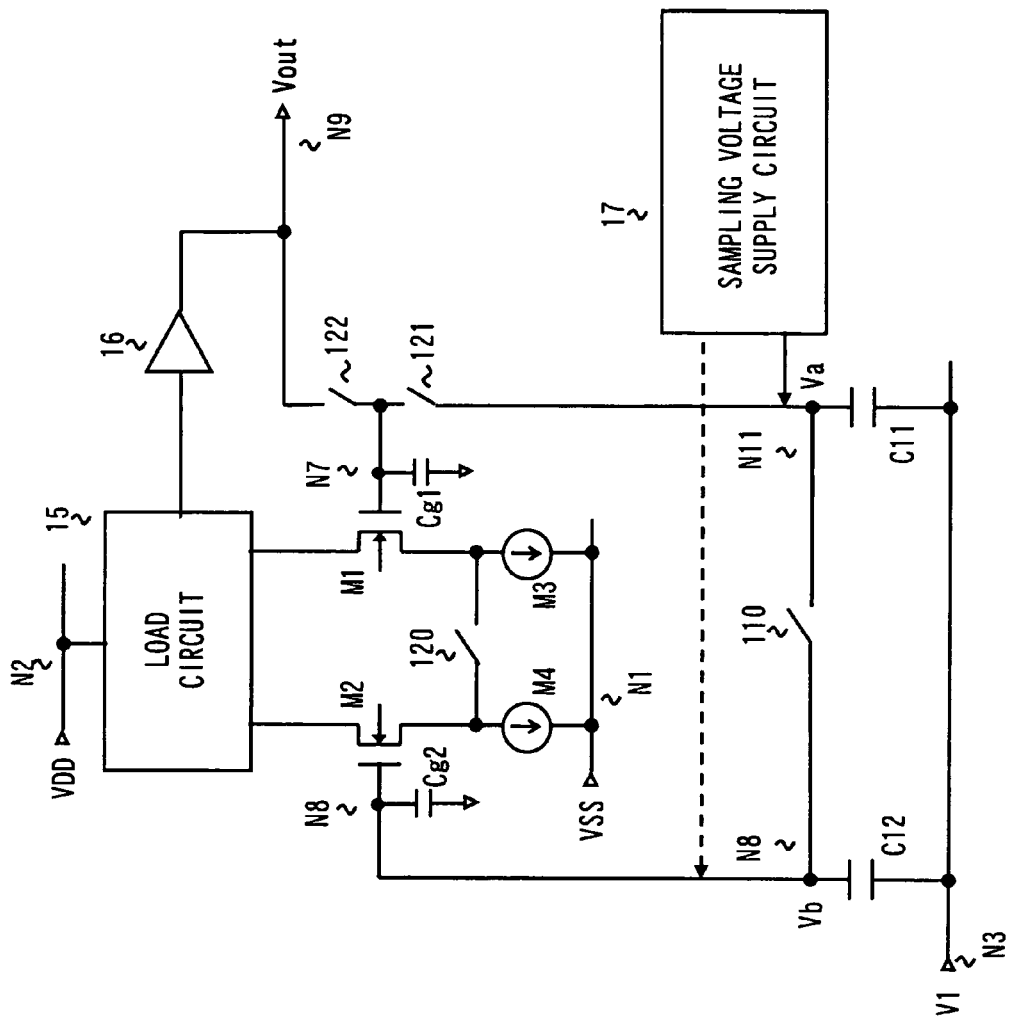
FIG. 1 is a circuit diagram showing the configuration of an exemplary embodiment of the present invention.

In one mode of the present invention, referring to FIG. 1, there are provided first and second capacitance elements (C11, C12), one ends (N11, N8) of which are connected together via a first switch (110), and a differential circuit. The differential circuit includes a differential input stage (M1, M2 and a load circuit) having an input pair, a first input of which is connected via a second switch (121) to the one end (N11) of the first capacitance element (C11), and a second input of which is connected to the one end (N8) of the second capacitance element (C12). The differential circuit also includes an amplifier stage (16) an input of which receives an output of the differential input stage and an output of which is connected to an output terminal (N9) of the sample and hold circuit and to the first input of the differential input stage via a third switch (122).

According to the present invention, there is provided a voltage supply circuit (17) that delivers a voltage to be sampled to the one end of at least one of the first and second capacitance elements (C11, C12). According to the present invention, there may also be provided a switch (153 of FIG. 5) that controls on and off of the connection between an output of the differential input stage and an input of the amplifier stage (16).

According to the present invention, the first and second capacitance elements (C1, C12) have one ends (N11, N8) connected together via the first switch (110), while having the opposite ends connected in common and connected to a node (N3) supplied with a reference voltage. The differential input stage includes first and second current sources (M3, M4) having one ends connected to the first power supply terminal (N1) and a first MOS transistor (M1) that has a gate terminal connected to the one end (N11) of the first capacitance element (C11) via the second switch (121) and connected via the third switch (122) to the output terminal (N9) of the sample and hold circuit. The gate terminal constitutes the first input. The first MOS transistor has a source terminal connected to the other end of the first current source (M3). The differential input stage also includes a second MOS transistor (M2) having a gate terminal connected to the one end (N8) of the second capacitance element (C12) and having a source terminal connected to the other end of the second current source (M4) and connected to the source of the first MOS transistor (M1) via the fourth switch (120). The gate terminal forms the second input. The differential input stage further includes a load circuit (15) connected between the drain terminals of the first and second MOS transistors and the second power supply terminal (N2).

According to the present invention, each data period has first, second and third time intervals. During the first time interval, the first, third and fourth switches (110, 122, 120) are turned off and the second switch (121) is turned on to deliver a voltage to be sampled at least to the one end (N11) of the first capacitance element (C11) and to the first input (N7) of the differential input stage. During the second time interval, the states of the second, third and fourth switches (121, 122, 120) are kept unchanged from the states thereof during the first time interval, while the first switch (110) is turned on to re-distribute electric charge between the first and second capacitance elements (C11, C12). During the third time interval, the first and second switches (110, 121) are turned off and the third and fourth switches (122, 120) are turned on to deliver an amplified result by the differential circuit to the output terminal.

According to the present invention, the voltage supply circuit (17) includes a switch between a power supply terminal and the one end of at least one of the first and second capacitance elements (C11, C12).

Figure 5:
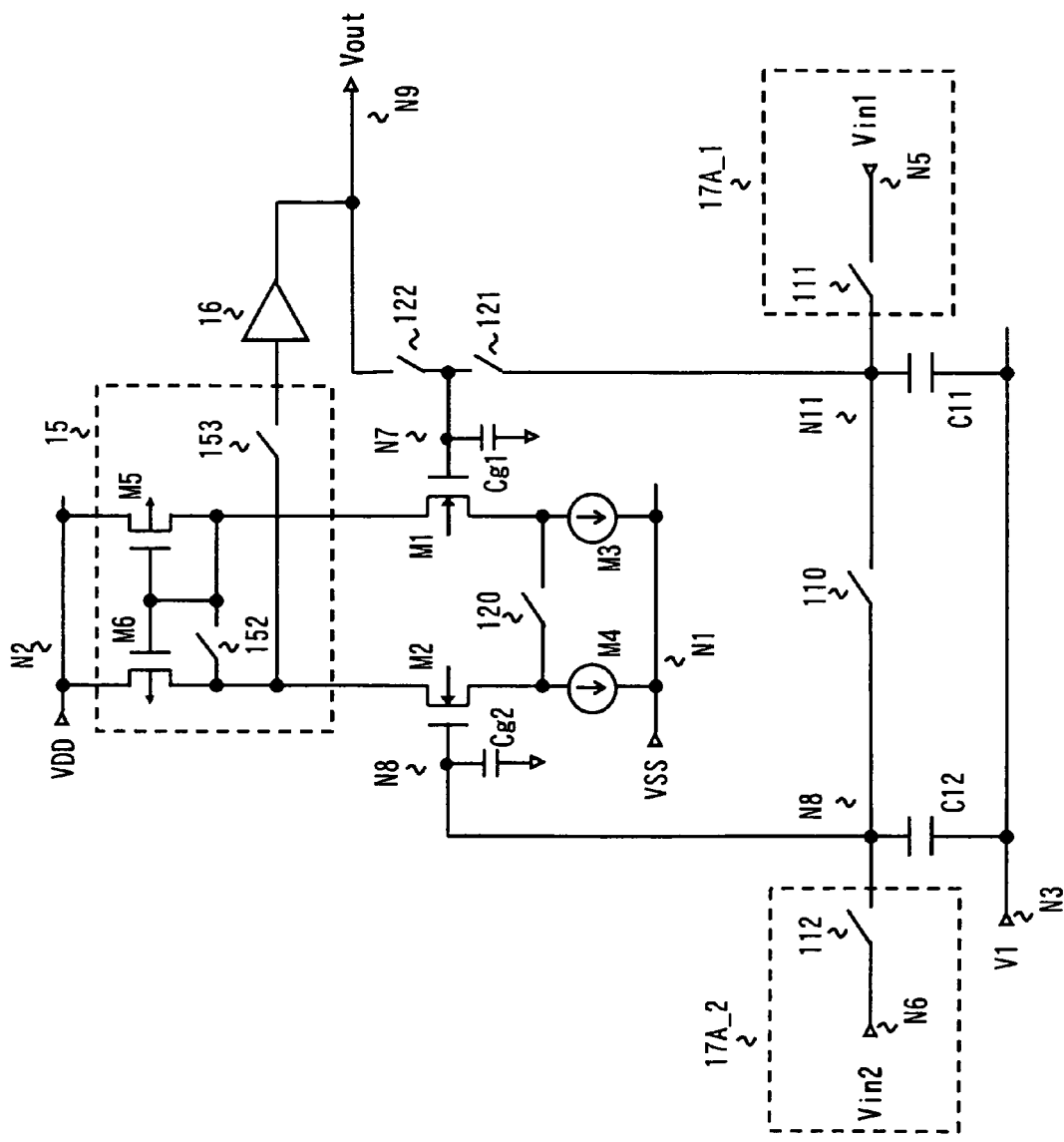
FIG. 5 is a circuit diagram showing the configuration of an exemplary embodiment of the present invention.

According to the present invention, referring to FIG. 5, the load circuit (15) includes third and fourth MOS transistors (M5, M6) having sources connected to the second power supply terminal (N2) and having a drain terminal connected to drain terminals of the first and second MOS transistors (M1, M2). The gate and the drain of the third MOS transistor (M5) are connected together. A fifth switch (153) is connected between a connection node of the drain terminals of the second and fourth MOS transistors (M2, M6) and an input of the amplifier stage, and a sixth switch (152) is connected between the gate and drain terminals of the fourth MOS transistor.

Figure 6:
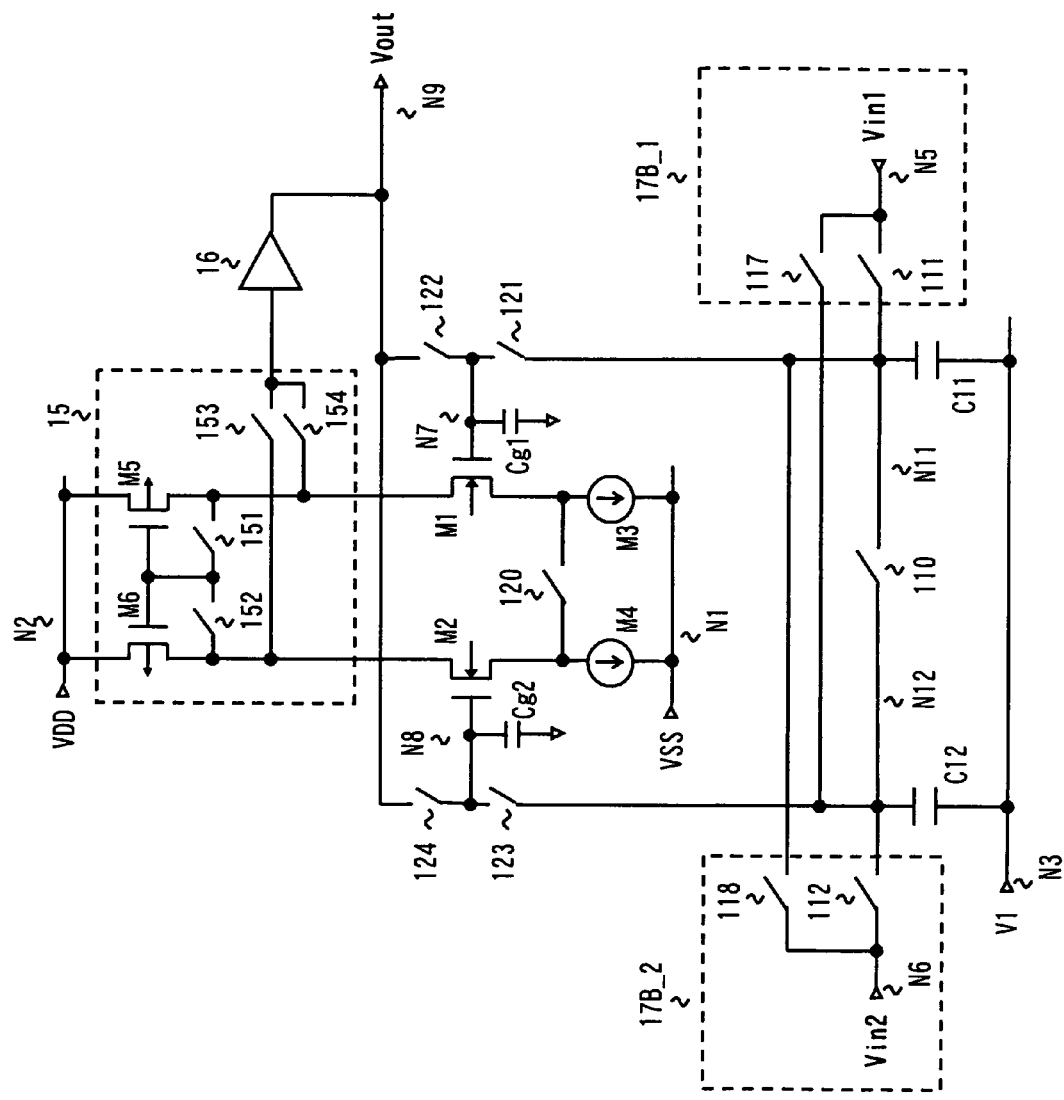
FIG. 6 is a circuit diagram showing the configuration of exemplary embodiment 2 of the present invention.

According to the present invention, referring to FIG. 6, the voltage supply circuit may include a first voltage supply circuit (17B_1) and a second voltage supply circuit (17B_2). The first voltage supply circuit includes seventh and eighth switches (111, 117) connected between the first voltage supply terminal (N5) and the one ends (N11, N12) of the first and second capacitance elements. The second voltage supply circuit includes ninth and tenth switches (112, 128) connected between the second voltage supply terminal (N6) and the one ends (N11, N12) of the first and second capacitance element.

According to the present invention, referring to FIG. 6, the first input (inverting input) and the second input (non-inverting input) of the differential input stage in the differential circuit may be reversed relative to each other. That is, the differential input stage includes a circuit that changes over a first connection state to a second connection state and vice versa. The first connection state is a connection state in which the first input of the differential input stage is an inverting input and the second input is a non-inverting input, and the second connection state is a connection state in which the second input of the differential input stage is an inverting input and the first input is a non-inverting input. The second input is connected via a switch (e.g. switch 123 of FIG. 6) to the one end (N12) of the second capacitance element (C12), while the output terminal (N9) is connected via switch (124) to the second input (N8). In the second connection state, the first input of the differential input stage operates as a non-inverting input. The switch (121) between the first input and the one end (N11) of the capacitance element (C11) is turned on, while the switch (122) between the first input and the output terminal (N9) is turned off.

Figure 8:
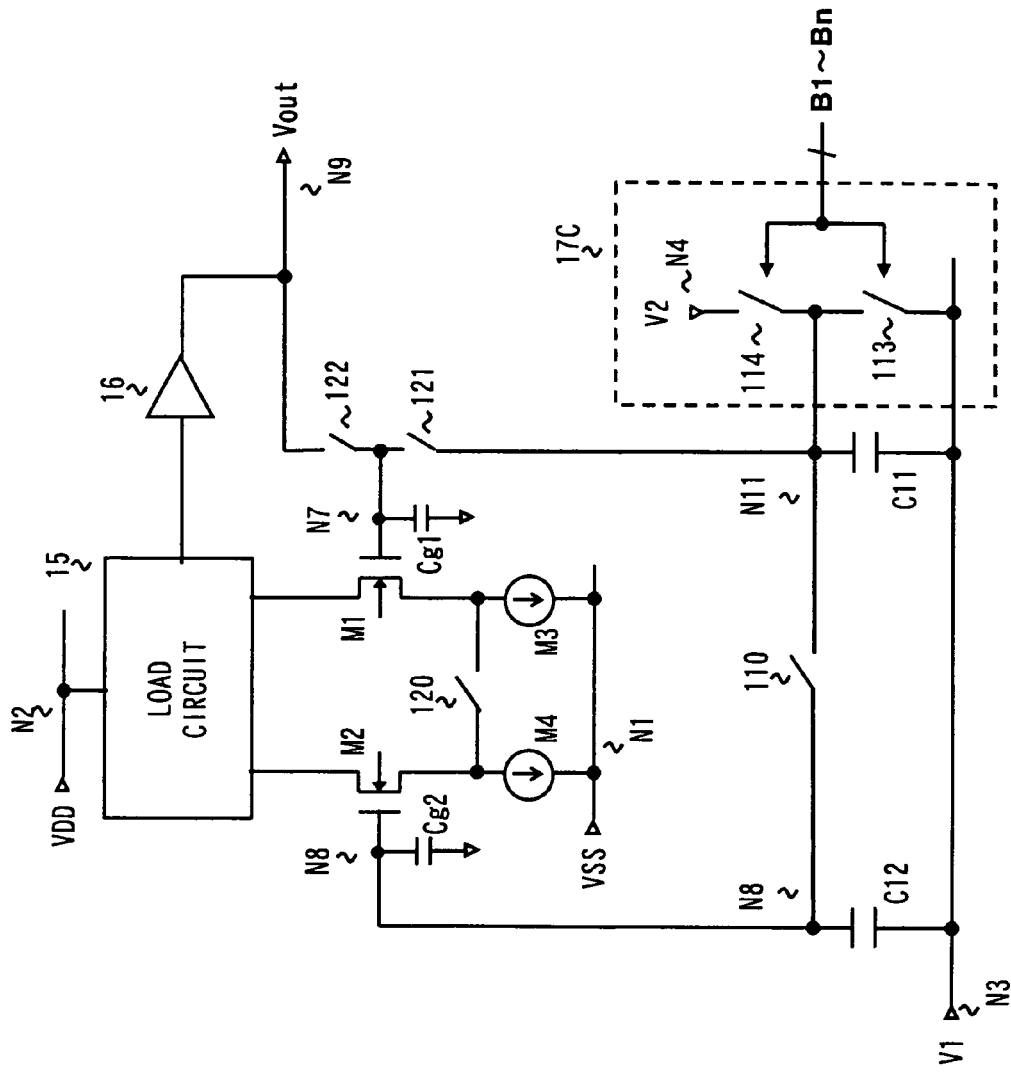
FIG. 8 is a circuit diagram showing the configuration of an exemplary embodiment 3 of the present invention.

Referring to FIG. 8, the present invention also provides a serial digital-to-analog converter circuit comprising the sample and hold circuit in which one of first and second voltages (V1, V2) is sequentially delivered to the one end of at least one of the first and second capacitance elements in response to the values of bit data of the digital signal to be input serially. Following a preset resetting time interval, the first time interval (sampling time interval) and the second time interval (charge re-distribution time interval) are allocated to each 1-bit data of an n-bit input digital signal (B1 to Bn), where n is a preset positive integer. During the first time interval, one of bi-level voltages (V1, V2) corresponding to bit data of the input digital signal is supplied to the one end of at least one of the first and second capacitance elements and, during the second time interval, electric charge are re-distributed between the first and second capacitance elements. The first and second time intervals are repeated n times in a corresponding relationship to an n-number of serially input bit data, before proceeding to an operation for amplification of the third time interval.

Figure 13:
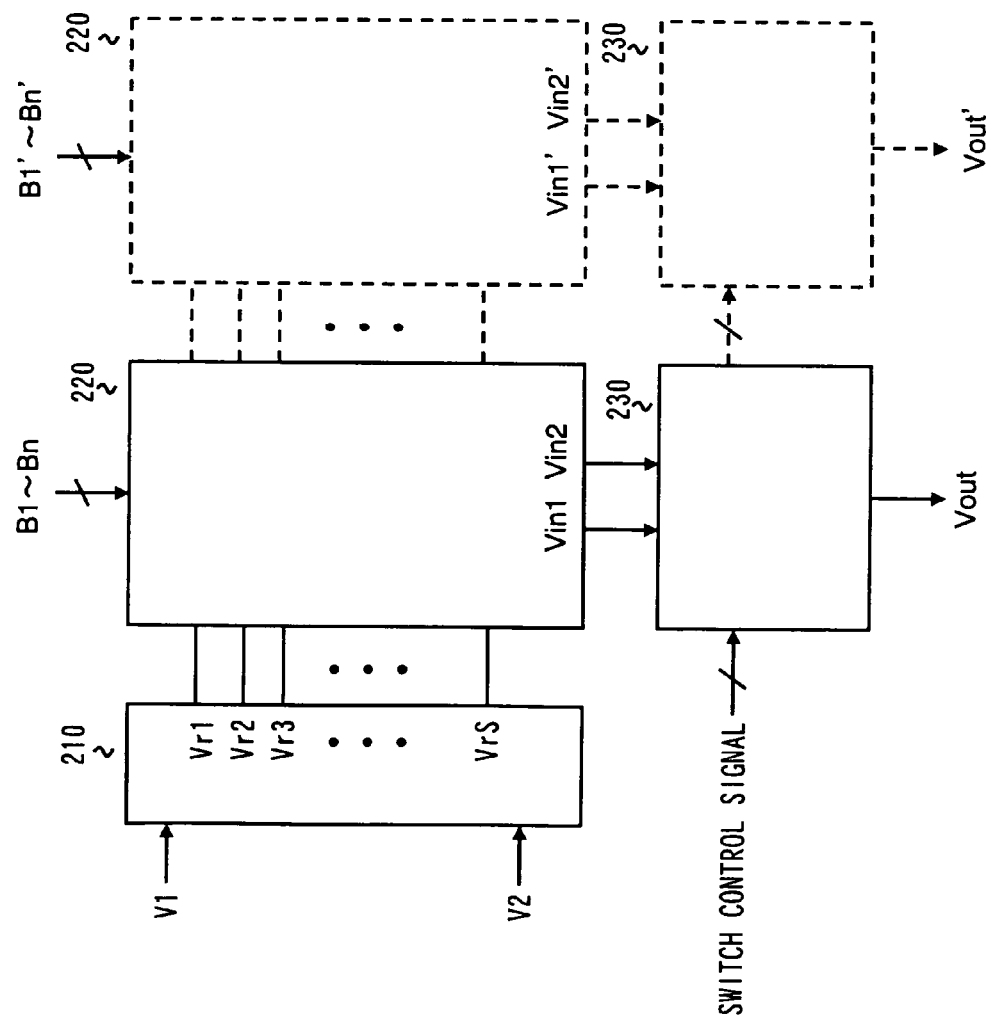
FIG. 13 is a circuit diagram showing the configuration of an exemplary embodiment 6 of the present invention.

Referring to FIG. 13, a digital-to-analog converter according to the present invention comprises a reference voltage generator (210 of FIG. 13), a decoder (220) and an output circuit (230). The reference voltage generator generates a plurality of different reference voltages. The decoder receives the plurality of reference voltages to select and output first and second reference voltages (Vin1, Vin2), inclusive of duplications, based on digital data associated with each output. The output circuit receives the first and second reference voltages as the first and second voltages to be sampled and operates in response to a switch control signal. The output circuit includes the sample and hold circuit of the present invention.

Figure 14:
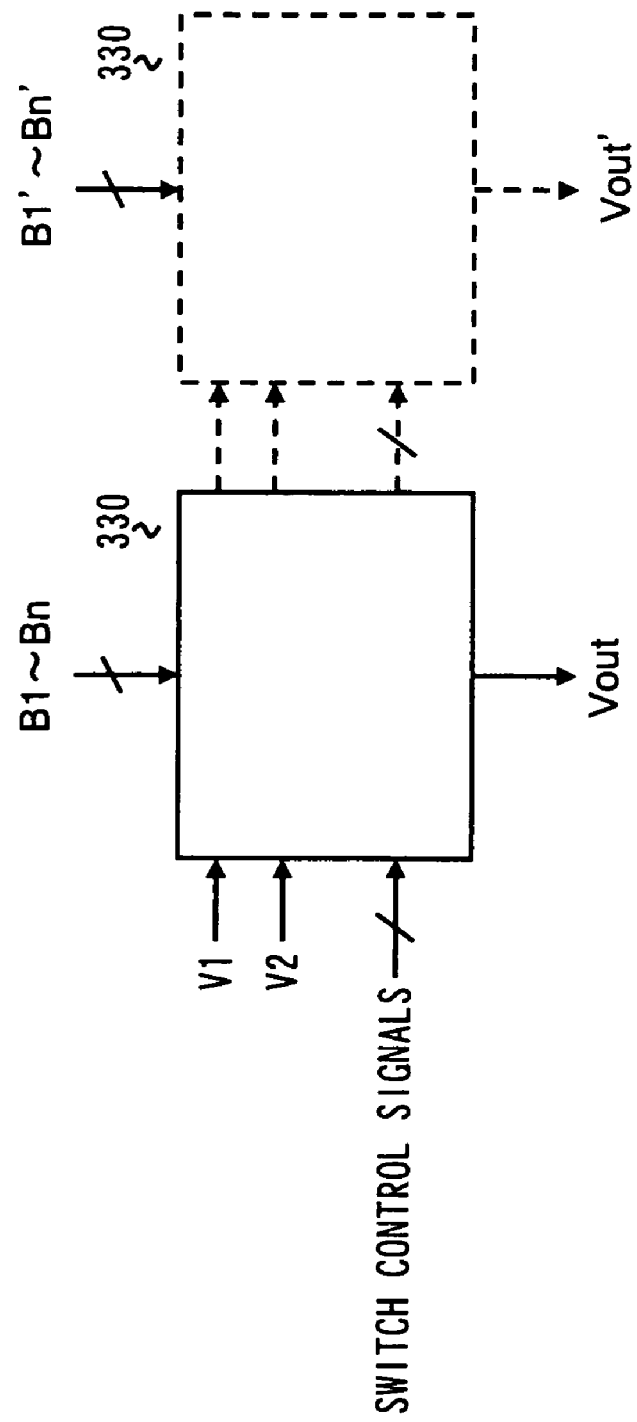
FIG. 14 is a circuit diagram showing the configuration of an exemplary embodiment 7 of the present invention.
Figure 15:
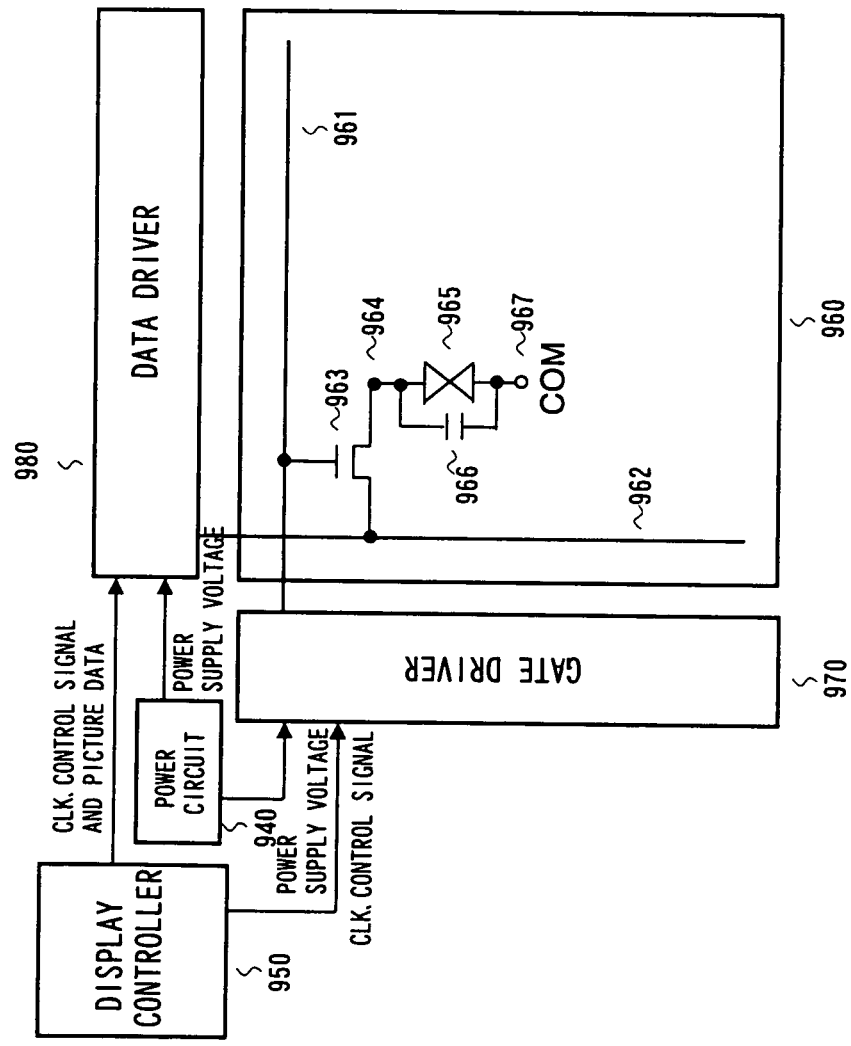
FIG. 15 is a circuit diagram showing an arrangement of a liquid crystal display.

Referring to FIG. 14, a digital-to-analog converter comprises an output circuit (330) operating in response to a switch control signal based on first and second reference voltages (V1, V2) and on digital data serially entered in association with each output. The output circuit is composed of a serial digital-to-analog converter circuit of the present invention.

Exemplary Embodiment 1

FIG. 1 is a circuit diagram showing a configuration of an exemplary embodiment 1 of the present invention. The present exemplary embodiment includes n-channel MOS transistors M1 and M2, a load circuit 15, an amplifier stage 16, a sampling voltage supply circuit 17, current sources M3 and M4, capacitance elements C11 and C12 and switches 110, 120, 121 and 122. The n-channel MOS transistors M1 and M2, the load circuit 15 and the current sources M3 and M4 compose a differential stage. The differential stage, the amplifier stage 16 and switches 120, 121 and 122 compose a differential circuit.

The n-channel MOS transistors M1 and M2 comprising a differential pair have drains connected via the load circuit 15 to a power supply node N2 of a power supply VDD, while having sources respectively connected via current sources M3 and M4 to a power supply node N1 of a low voltage power supply VSS and having gates respectively connected to nodes N7 and N8. Capacitance Cg1 across the node N7 and the power supply VSS and capacitance Cg2 across the node N8 and the power supply VSS represent gate parasitic capacitances of the transistors M1 and M2, respectively.

An output of the load circuit 15 is delivered to the amplifier stage 16, an output of which is connected to an output node N9. The switch 122 is connected between an output node N9 and a node N7. The switch 121 has one end connected to a connection node of the node N7 and the switch 122, while having the other end connected to a node N11. The capacitance element C11 is connected between the nodes N11 and N3, while the capacitance element C12 is connected between nodes N8 and N3. The switch 110 is connected between the nodes N8 and N11, while the switch 120 is connected between the sources of the transistors M1 and M2. The current values of the current sources M3 and M4 are set so as to be equal to each other, while the capacitance values of the capacitance elements C11 and C12 are set so as to be equal to each other.

Figure 2:
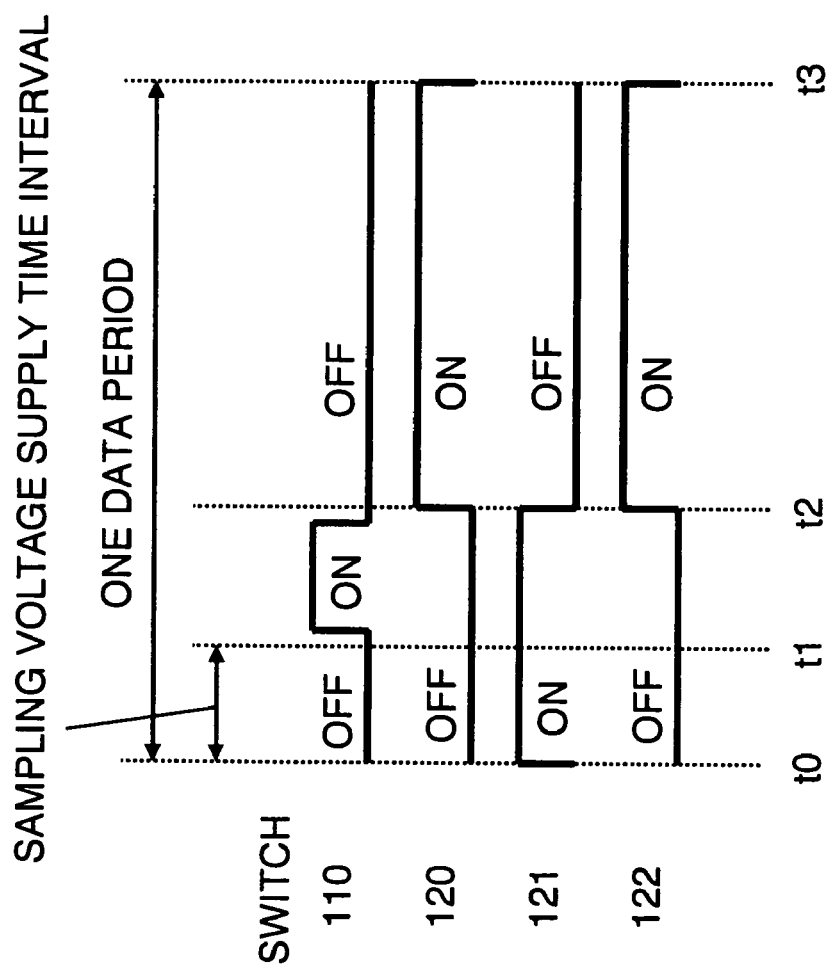
FIG. 2 is a timing chart for illustration of the operation of FIG. 1.

FIG. 2 is a timing chart for illustrating the operation of FIG. 1 with regard to switch control.

During the t0-t1 time interval (sampling period), a sampling voltage is applied from a sampling voltage supply circuit, not shown, to at least one of the nodes N8 and N11.

At this time, the switch 121 is turned ON, while the switch 122 is turned OFF to provide for a symmetrical configuration of a differential stage. The switches 110 and 122 are turned OFF.

At time t1, the terminal voltage at the capacitances C11 and Cg1 is Va, and at the capacitances C12 and Cg2 is Vb.

The charges stored at the capacitances C11 and Cg1 are (C11+Cg1)×Va, while those stored at the capacitances C12 and Cg2 are (C12+Cg2)×Vb. With the switch 120 being OFF, the transistors M1 and M2 are both ON, with the gate capacitances Cg1 and Cg2 of the transistors M1 and M2 being kept so as to be substantially equal to each other.

During the t1-t2 time interval (charge distribution or voltage averaging time interval), the switch 110 is turned ON, as the ON/OFF states of the switches 120 to 122 are kept, such as to distribute electric charge between the capacitances C11 and Cg1 on one hand and the capacitances C12 and Cg2 on the other hand.

This sets the voltage at the node N7 (N11) and at the node N8 to (Va+Vb)/2.

$$\{(C11 + Cg1) \times Va + (C12 + Cg2) \times Vb\}/(C11 + Cg1) + (C12 + Cg2)) =$$
$$(C11 + Cg1) \times (Va + Vg)/[2 \times (C11 + Cg1)] = (Va + Vb)/2$$

After voltage distribution, the switch 110 is turned OFF.

During the t2-t3 time interval (driving time interval), the switch 121 is turned OFF, while the switches 120 and 122 are turned ON, so that the differential circuit operates as a voltage follower. The voltage (Va+Vb)/2 at the node N8 is output from an output node N9 as an output voltage Vout. At this time, the switch 110 is kept OFF.

Figure 16:
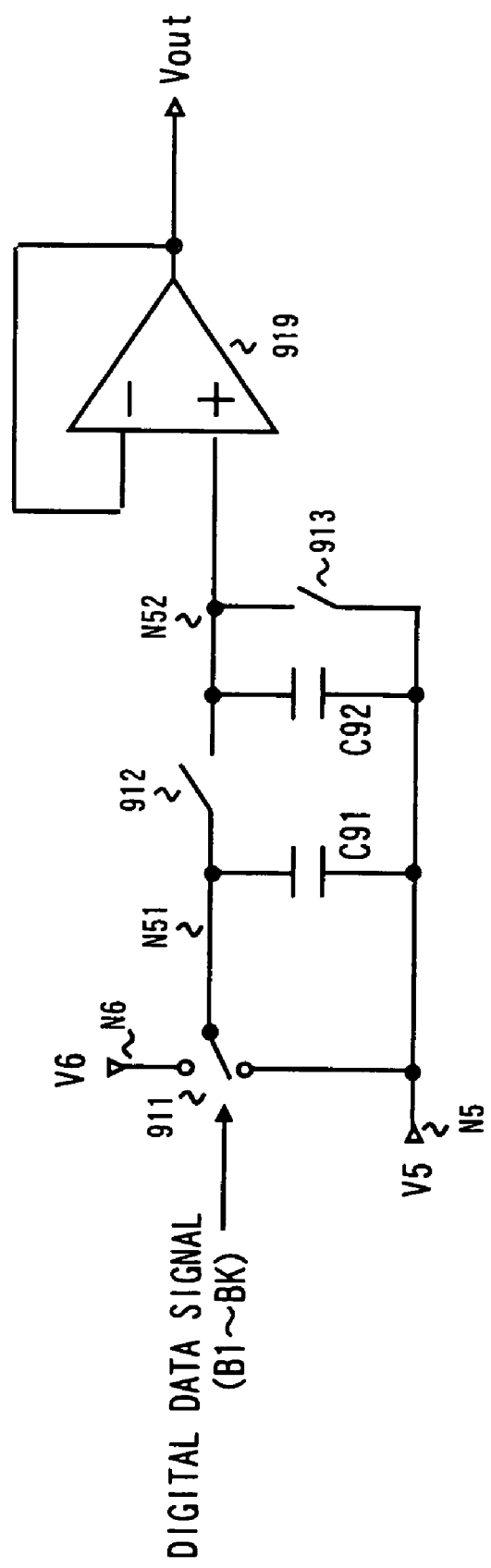
FIG. 16 is a schematic circuit diagram showing a configuration of Patent Document 1.

In this manner, the electric charge inclusive of the gate capacitances Cg1 and Cg2 of the transistors M1 and M2 of the differential stage are distributed, so that it is possible to suppress output errors attributable to the gate capacitances of the transistors of the differential pair shown in FIG. 16. As a result, the capacitances C11 and C12 and hence the circuit area may be reduced.

The amplifier stage 16 is inactivated and activated during the t0-t2 time interval and during the t2-t3 time interval, respectively. The electrical connection between the output of the differential pair (output of the load circuit 15 in FIG. 1) and the amplifier stage 16 may be turned OFF during the t2-t3 time interval.

Figure 3:
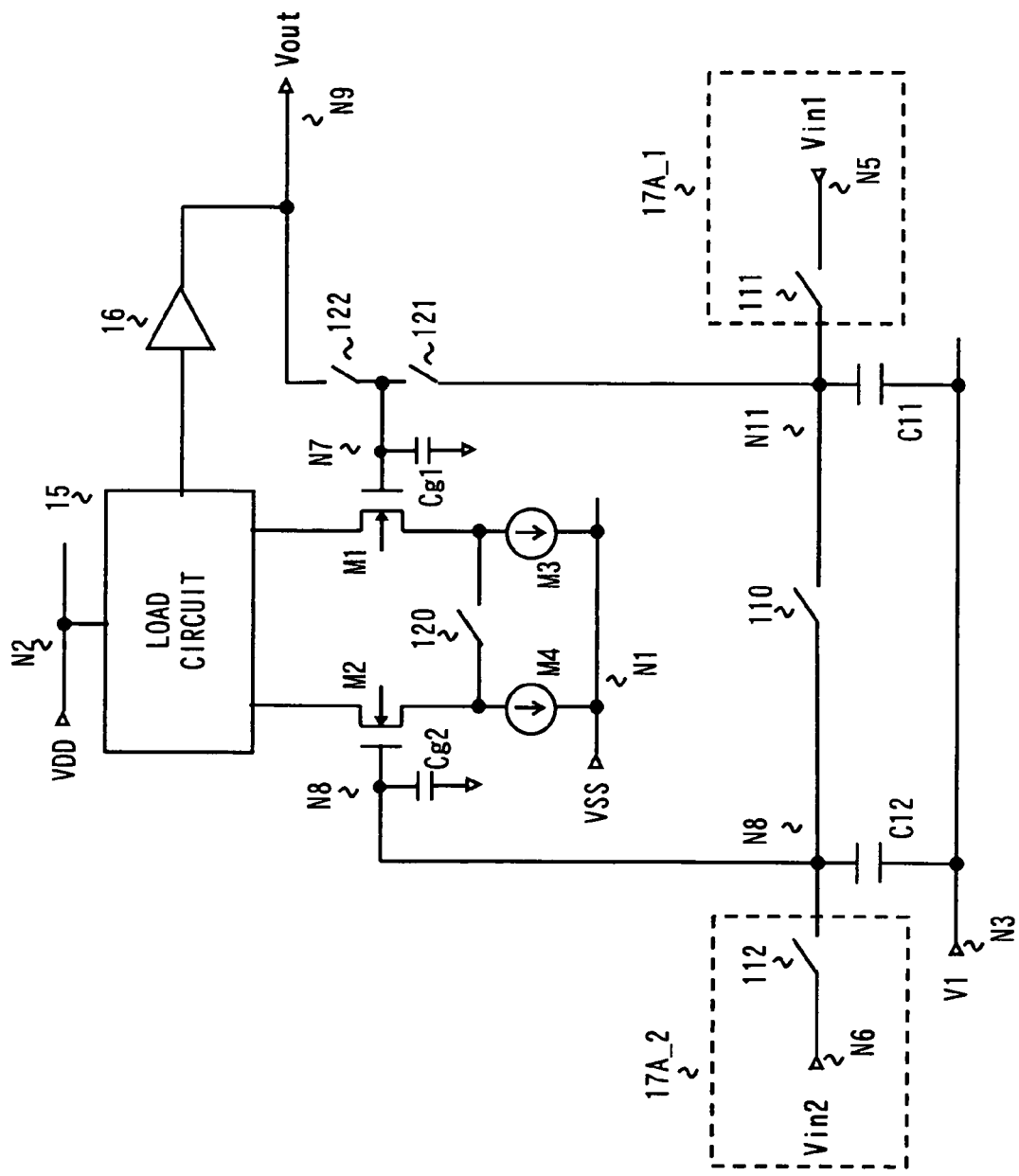
FIG. 3 is a circuit diagram showing the configuration of an exemplary embodiment of the present invention.

FIG. 3 shows a configuration of the sampling voltage supply circuit 17 of FIG. 1. The sampling voltage supply circuit 17 includes a circuit 17A_1 that delivers a voltage Vin1 to the node N11 and a circuit 17A_2 that delivers a voltage Vin2 to the node N8. The circuit 17A_1 includes a switch 111 between the node N11 and the voltage supply terminal Vin1, while the circuit 17A_2 includes a switch 112 between the node N8 and the voltage supply terminal Vin2. The current values of the current sources M3 and M4 are set to equal values. The capacitance values of the capacitance elements C11 and C12 are also set to equal values.

Figure 4:
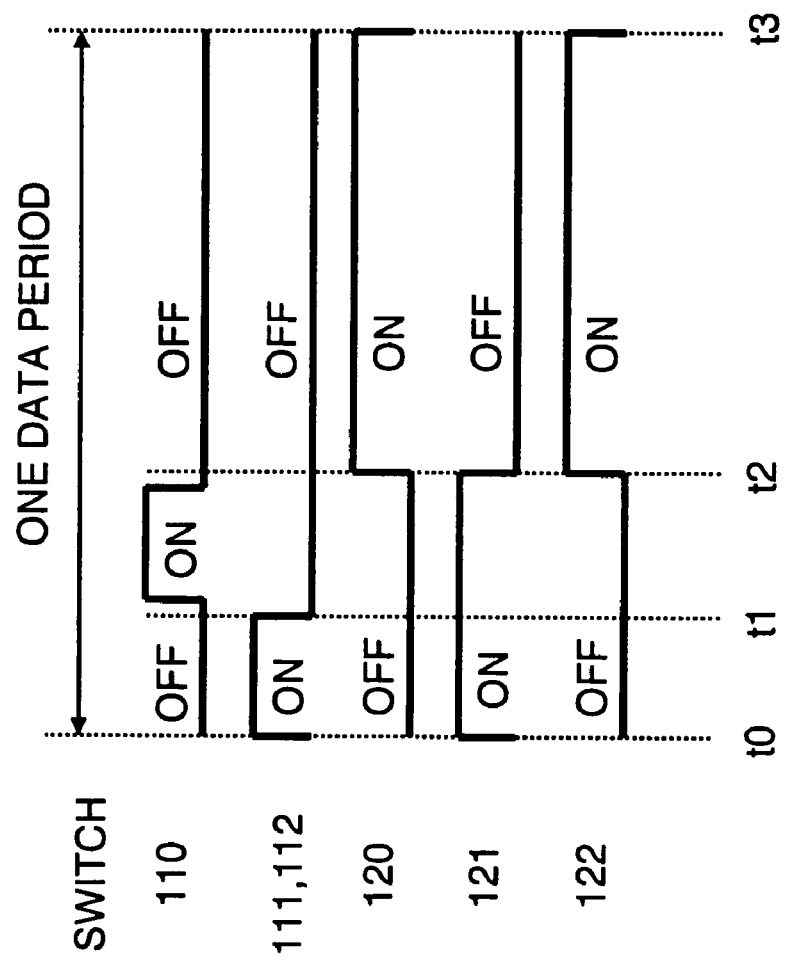
FIG. 4 is a timing chart for illustration of the operation of the exemplary embodiment of the present invention.

FIG. 4 depicts a timing chart for illustrating the operation of FIG. 3. During the t0-t1 time interval (sampling time interval), the switches 111 and 112 are turned ON, so that the voltage Vin1 is applied to the terminals of the capacitance C11 and Cg1, while the voltage Vin2 is applied to the terminals of the capacitance C12 and Cg2. At this time, the switch 121 is turned ON, and the switch 122 is turned OFF to provide for symmetrical configuration of the differential stage. The switch 120 is turned OFF so that, even if the voltages Vin1 and Vin2 are different from each other, the gate capacitance Cg1 of the transistor M1 and the gate capacitance Cg2 of the transistor M2 will be kept approximately equal to each other.

During the t1-t2 time interval (charge distributing or voltage averaging out time interval), the switches 111, 112 are turned OFF, after which the switch 110 is turned ON to distribute electric charge between the capacitances C11 and Cg1 on one hand and the capacitances C12 and Cg2 on the other hand. This sets both the voltage at the node N7 (N11) and that at the node N8 to (Vin1+Vin2)/2. The switch 110 is then turned OFF. Meanwhile, the switches 120 to 122 are kept in the ON or OFF state that prevailed during the t0-t1 time interval.

During the t2-t3 time interval (driving time interval), the switch 121 is turned OFF, while the switches 120 and 122 are turned ON. The differential circuit operates as a voltage follower, so that the voltage (Vin1+Vin2)/2 at the node N8 is delivered from the output node N9 as the output voltage Vout. At this time, the switch 110 is OFF, while the switches 111 and 112 are kept in the OFF state that prevailed during the t1-t2 time interval.

With the present Example, electric charge inclusive of the gate capacitances Cg1 and Cg2 of the transistors M1 and M2 of the differential pair are distributed under the control managed as described above. It is thus possible to suppress the output error attributable to the effect of the gate capacitances of the transistors of the differential pair shown in FIG. 16.

As a result, the capacitance values of capacitance elements C11 and C12 may be reduced to allow for reducing the circuit area. Preferably, the amplifier stage 16 is inactivated and activated during the t0-t2 time interval and during the t2-t3 time interval, respectively.

FIG. 5 is a circuit diagram showing a concrete example of the load circuit 15 of FIG. 3. The load circuit includes p-channel MOS transistors M5, M6 having sources connected to the power supply node N2, having gates connected together and having drains connected to the drains of the n-channel MOS transistors M1 and M2. The drain and the gate of the p-channel MOS transistor M5 are connected together, and a switch 152 is connected between the drain and the gate of the transistor M6. A switch 153 is connected between a connection node of the drains of the transistors M2 and M6 and an input terminal of the amplifier stage 16.

The switch 152 is turned ON during the t0-t2 time interval of FIG. 4 to keep the transistors M1 and M2 in states equal to each other as well as to provide for equal values of the gate capacitances Cg1 and Cg2.

During the t0-t2 time interval of FIG. 4, it is preferred that the switch 153 is OFF and the amplifier stage 16 is in inactivated state.

During the t2-t3 time interval of FIG. 4, the switches 152, 153 are turned OFF and ON, respectively, to activate the amplifier stage 16 to output a voltage corresponding to the potential at the node N8 as the output voltage Vout. The configuration of the load circuit 15 is not limited only to that shown in FIG. 5, wherein the p-channel MOS transistors M5 and M6 compose a current mirror. For example, the load circuit may be composed by a pair of resistive load elements connected between the drains of n-channel MOS transistors M1 and M2 and the power supply node N2. In this case, the switch 152 is omitted.

Exemplary Embodiment 2

FIG. 6 is a circuit diagram of an exemplary embodiment 2 showing a configuration of a circuit adapted from FIG. 5. In this exemplary embodiment 2, the non-inverting input/inverting input relationship of the differential pair (M1, M2) is changed over at a preset period. In FIG. 5, the gate of the MOS transistor M1 is the inverting input, while the gate of the MOS transistor M2 is the non-inverting input. In the exemplary embodiment 2, this non-inverting input/inverting input relationship is interchanged at a preset period.

Referring to FIG. 6, there are provided switches 124, 123, 111, 117, 118 and 112. The switch 124 is connected between the output node N9 and the gate of the MOS transistor M2 (node N8), and the switch 123 is connected between the gate of the MOS transistor M2 and the one end (node N12) of the capacitance element C12. The switch 111 is connected between the one end (node N11) of the capacitance element C11 and the node N5, while the switch 117 is connected between the one end (node N12) of the capacitance element C12 and the node N5. The switch 118 is connected between the one end (node N11) of the capacitance element C11 and the node N6, while the switch 112 is connected between the one end (node N12) of the capacitance element C12 and the node N6.

The load circuit (15) includes MOS transistors M5 and M6, having sources connected to the power supply node N2, having gates connected together and having drains respectively connected to the drains of the MOS transistor M1 and M2. A switch 151 is connected between the gate and the drain of the MOS transistor M5, while a switch 152 is connected between the gate and the drain of the MOS transistor M6. A switch 153 is connected between a connection node of the drains of the MOS transistors M2 and M6 and an input terminal of the amplifier stage (16), while a switch 154 is connected between a connection node of the drains of the MOS transistors M1 and M5 and the input terminal of the amplifier stage (16). As in FIG. 5, a switch 122 is connected between the output node N9 and the gate of the MOS transistor M1, while a switch 121 is connected between the gate of the MOS transistor M1 and one end of the capacitance element C11. With this configuration, variations in the characteristic of the differential pair (M1, M2) or variations in capacitance values of the capacitance elements C11 and C12 may be time-averaged to reduce the output offset.

Figure 7:
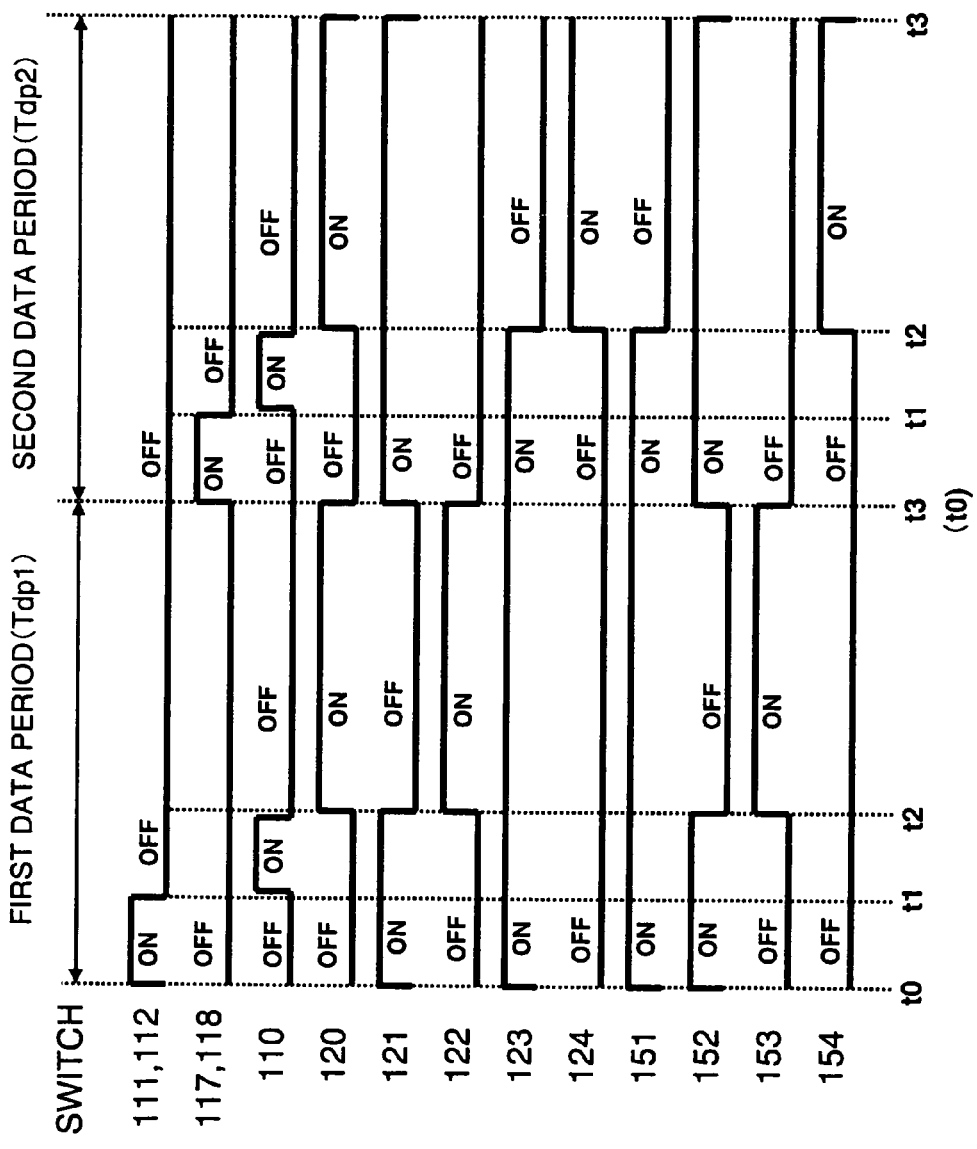
FIG. 7 is a timing chart for illustration of the operation of the exemplary embodiment 2 of the present invention.

FIG. 7 depicts a timing chart of each switch control of FIG. 6. During the first data period (Tdp1), switch control of FIG. 6 is equivalent to that of FIG. 4 managed with the use of the circuit of FIG. 3. That is, the gate (node N8) of the transistor M2 becomes a non-inverting input end to deliver the potential corresponding to electric charge distributed to the capacitances (C12+Cg2) as the output voltage Vout.

More specifically, with reference to FIG. 7, in the time interval t0-t1 (sampling time interval) of the first data time interval (Tdp1), the switches 121, 111, 112, 151, 152, and 123 are turned on, the switches 110, 122, 120, 117, 118, 153, 154 and 124 are turned off. The differential stage is of a symmetrical configuration, the voltage Vin1 is applied to the capacitances C11 and Cg1 and the voltage Vin2 is applied to the capacitances C12 and Cg2.

In the time interval t1-t2 (electric charge redistribution (electric charge averaging) time interval), the switches 111 and 112 are turned off, the switches 121, 151, 152 and 123 are turned on, the switches 122, 120, 117, 118, 153, 154 and 124 are turned off and the switch 110 is turned on. The redistribution of electric charge among the capacitances C11, Cg1, C12 and Cg2. As a result, the node N7(N11) and node N8(N12) assume a voltage of (Vin1+Vin2)/2.

In the time interval t2-t3 (driving time interval), the switches 110, 121, 111, 112, 117, 118, 152, 154, and 124 are turned off, and the switches 122, 120, 151, 153 and 123 are turned on. The differential circuit operates as a voltage follower and the voltage (Vin1+Vin2)/2 at the node N8 (N12) is output as the output voltage Vout from the output node N9.

During the second data period (Tdp2), the gate of the transistor M1 (node N7) becomes a non-inverting input to deliver the potential corresponding to electric charge distributed to the capacitances (C11+Cg1) as the output voltage Vout.

More specifically, with reference to FIG. 7, in the time interval t0-t1 (sampling time interval) of the second data time interval (Tdp2), the switches 121, 117, 118, 151, 152, and 123 are turned on, the switches 110, 122, 120, 111, 112, 153, 154 and 124 are turned off. The differential stage is of a symmetrical configuration, the voltage Vin2 is applied to the capacitances C11 and Cg1 and the voltage Vin1 is applied to the capacitances C12 and Cg2.

In the time interval t1-t2 (electric charge redistribution (electric charge averaging) time interval), the switches 117 and 118 are turned off, the switches 121, 151, 152 and 123 are turned on, the switches 122, 120, 111, 112, 153, 154 and 124 are turned off and the switch 110 is turned on. The redistribution of electric charge among the capacitances C11, Cg1, C12 and Cg2. As a result, the node N7(N11) and node N8(N12) assume a voltage of (Vin1+Vin2)/2.

In the time interval t2-t3 (driving time interval), the switches 110, 122, 111, 112, 117, 118, 151, 153, and 123 are turned off, and the switches 121, 120, 152, 154 and 124 are turned on. The differential circuit operates as a voltage follower and the voltage (Vin1+Vin2)/2 at the node N7 (N11) is output as the output voltage Vout from the output node N9.

By switching between the first data period (Tdp1) and the second data period (Tdp2) at a preset period, variations in characteristics of the differential pair (M1, M2) or in the capacitance values of the capacitances C11 and C12 may be time-averaged to effectively reduce an output offset.

Exemplary Embodiment 3

FIG. 8 shows a configuration of an exemplary embodiment 3 of the present invention. In the present exemplary embodiment, a sampling voltage supply circuit 17C controls the ON or OFF state of switches 113 and 114 in response to bit data of a digital signal serially delivered as input during a sampling period. The switch 114 is provided between nodes N4 and N11, and the switch 113 is provided between nodes N11 and N3. The current values of current sources M3 and M4 are set so as to be equal to each other, and the capacitance values of capacitances C11 and C12 are set so as to be equal to each other. The sampling voltage supply circuit 17C may also be connected to the node N8.

Figure 9:
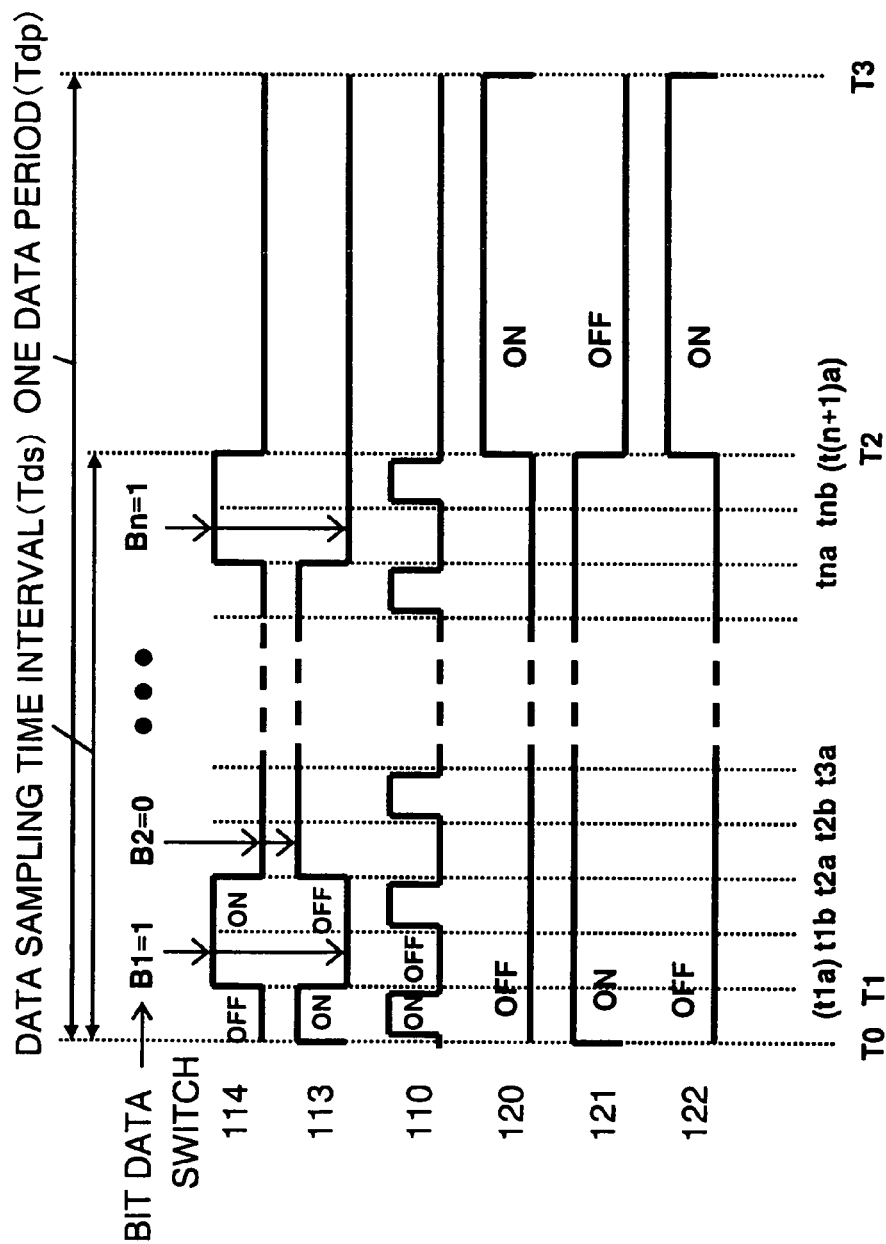
FIG. 9 is a timing chart for illustration of the operation of the exemplary embodiment 3 of the present invention.

FIG. 9 is a timing chart for illustrating the operation of FIG. 8 with regard to switch control. During the T0-T2 time interval, which is a data sampling time interval, the switch 121 is ON, while the switches 120 and 122 are OFF.

During the T0-T1 time interval, which is a resetting time interval, the switches 110 and 113 are turned ON, while the switch 114 is turned OFF to reset the capacitances C11, C12, Cg1 and Cg2 to a voltage V1.

As from time T1 (=t1a) until time T2 (=t(n+1)a), bit data are sequentially sampled. In the time interval T1-T2, the first time interval (sampling interval) and the second interval (electric charge redistribution interval) are allocated to each one bit data of n-bit digital signal (B1 to Bn) that is serially input, where n is a preset positive integer. Assuming that the first and second time intervals corresponding to X th bit data are tXa-tXb and tXb-t(X+1)a, the first and second time intervals (that is, time interval tXa-t(X+1)a) are repeated, n-times, that is, from X=1 to X=n.

During a time interval as from tXa until time t(X+1)a, when bit data Bx=0, the switch 114 is OFF, while the switch 113 is ON. Hence, electric charge is stored in capacitances C11 and Cg1, connected to the node N11, to the voltage V1.

When the bit data Bx=1, the switch 114 is ON, while the switch 113 is OFF. Hence, electric charge is stored in the capacitances C11 and Cg1, connected to the node N11, to the voltage C2.

The switch 110 is turned OFF as from a time immediately before time tXa until directly after time tXb, while being turned ON as from a time directly after time tXb until immediately before time t(X+1)a. During a time interval as from tXb until t(X+1)a, the capacitance element C11 and the gate capacitance Cg1 are connected to the capacitance element C12 and the gate capacitance Cg2 to re-distribute or average out the electric charge stored in the respective capacitances.

Thus, at time T2, a plurality of voltage levels, more precisely, electric charge corresponding to the voltage levels, obtained on division at a number of equal sub-intervals of the interval between the voltages V1 and V2 corresponding to a power of 2 ($2^n$, ^ being a power), are stored in the capacitance element C12 and the gate capacitance Cg2, connected to the node N8.

During a time interval T2-T3 (driving time interval), the switch 121 is turned OFF, while the switches 120, 122 are turned ON. Hence, the voltage at the node N8 is output from the output node N9 as a voltage Vout by the voltage follower operation of the differential circuit. At this time, the switches 110, 113, 114 are OFF. Since electric charge, inclusive of the gate capacitances Cg1 and Cg2 of the transistors M1 and M2 of the differential pair, are distributed, it is possible to suppress an output error attributable to the gate capacitances of transistors of the differential pair such as is encountered with the conventional technique. As a result, the capacitance elements C11 and C12 may be reduced to decrease the circuit area.

Exemplary Embodiment 4

Figure 10:
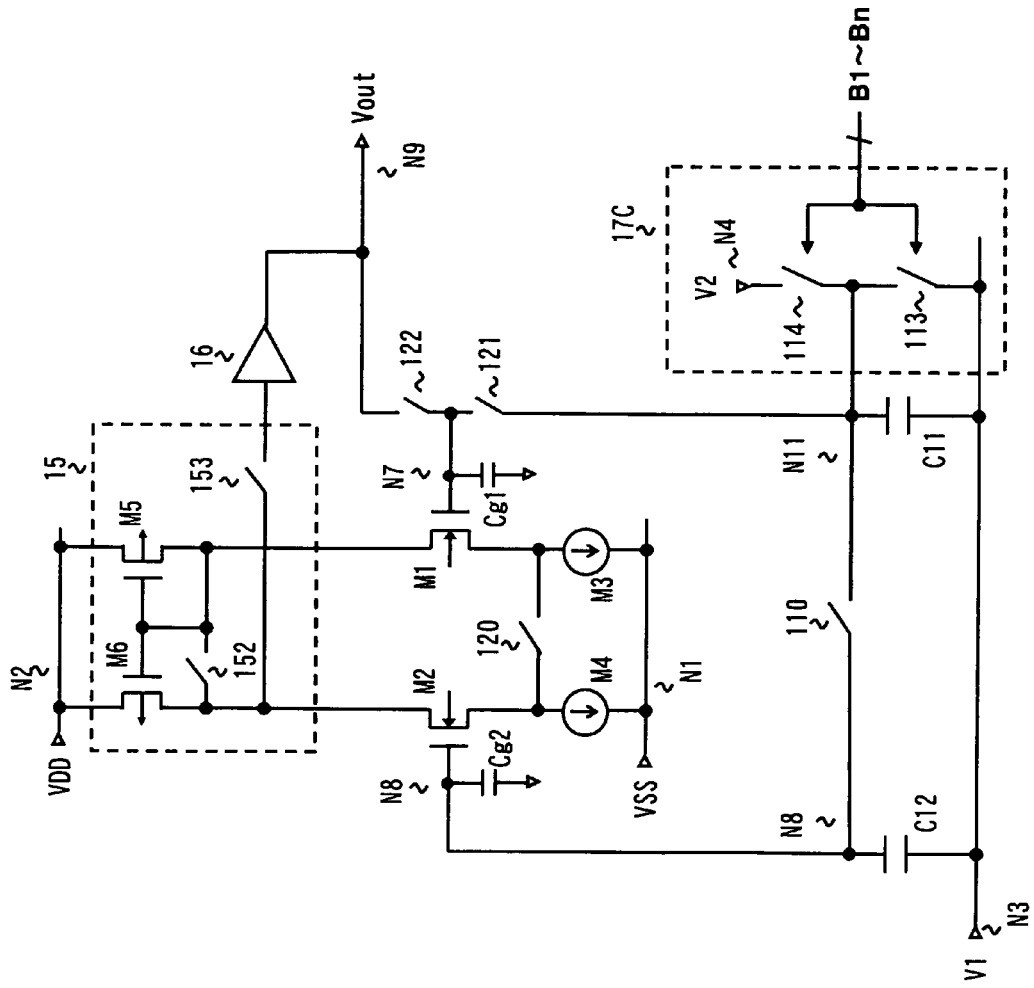
FIG. 10 is a timing chart for illustration of the operation of an exemplary embodiment 4 of the present invention.

FIG. 10 depicts the configuration of an exemplary embodiment 4 of the present invention and, more specifically, depicts a concrete example of the load circuit 15 of FIG. 8. The configuration of the exemplary embodiment 4 other than that of the load circuit 15 is the same as FIG. 8.

Referring to FIG. 10, the load circuit 15 includes p-channel MOS transistors M5 and M6, connected between the drains of n-channel MOS transistors M1 and M2 and the power supply VDD and having gates connected together. The drain and the gate of the p-channel MOS transistor M5 are connected together, and a switch 152 is connected between the drain and the gate of the p-channel MOS transistor M6. The switch 152 is turned ON during the T0-T2 time interval of FIG. 9 to keep the transistors M1 and M2 in equal states to keep the gate capacitances Cg1 and Cg2 equal to each other.

During the T0-T2 time interval, the switch 153 is preferably turned OFF to inactivate the amplifier stage 16. During the T2-T3 time interval, the switches 152 and 153 are respectively turned OFF and ON to activate the amplifier stage 16 to deliver a voltage corresponding to the potential at the node N8 from the output node N9 as an output voltage Vout.

Exemplary Embodiment 5

Figure 11:
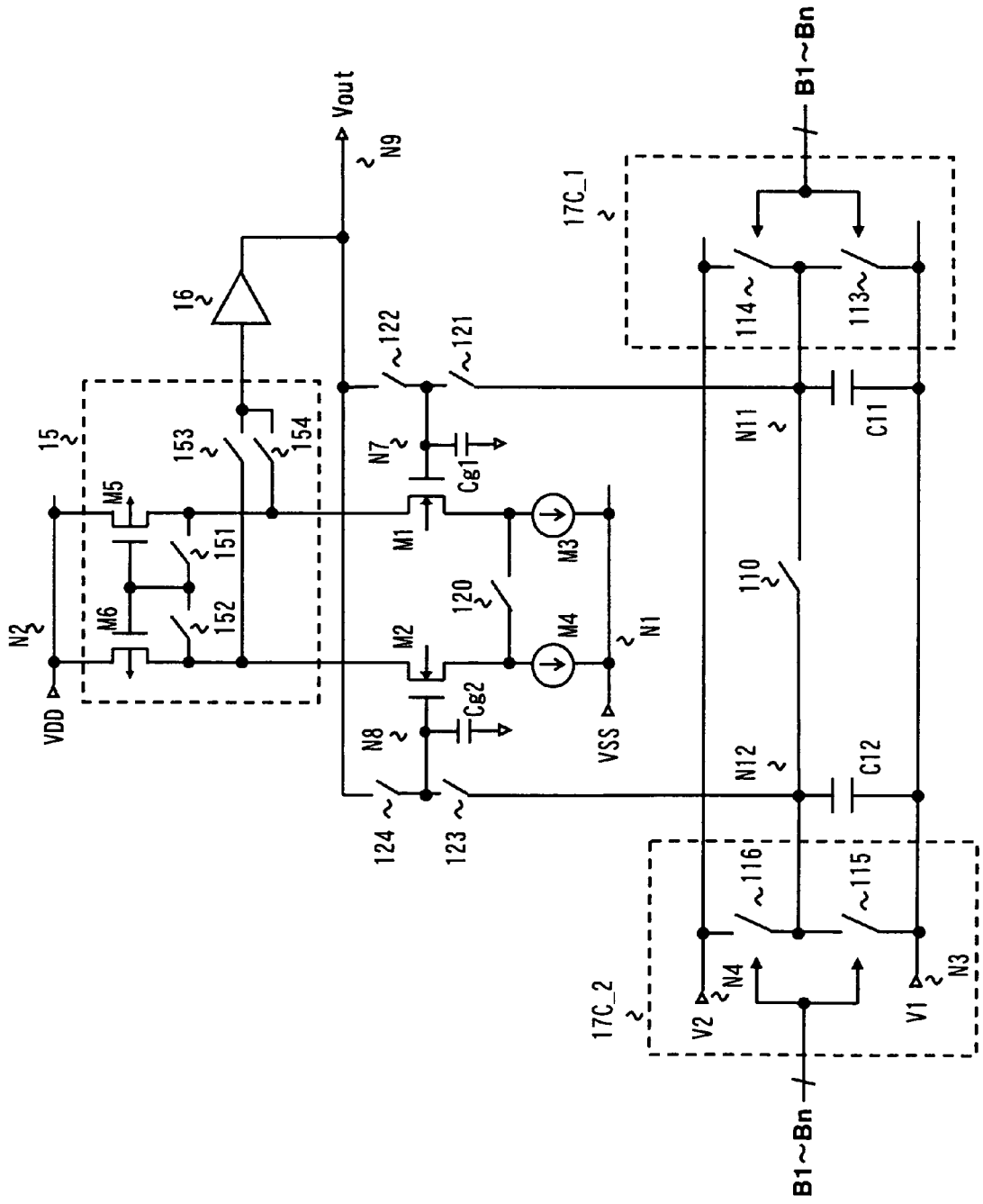
FIG. 11 is a timing chart for illustration of the operation of an exemplary embodiment 5 of the present invention.

FIG. 11 depicts the configuration of an exemplary embodiment 5 of the present invention and, more specifically, shows a circuit adapted from the circuit of FIG. 10. Referring to FIG. 11, the non-inverting input/inverting input relationship of the differential pair (M1, M2) is changed over at a preset period. The circuit configuration includes a circuit 17C_1 that delivers the voltage V1 or V2 to the node N11, and a circuit 17C_2 that delivers the voltage V1 or V2 to the node N12. The circuit 17C_1 includes a switch 114 between the node N11 and the voltage supply node N4, while including a switch 113 between the node N11 and the voltage supply node N3. The circuit 17C_2 includes a switch 116 between the node N12 and the voltage supply node N4, while including a switch 115 between the node N12 and the voltage supply node N3. The circuit configuration of the present Example also includes a switch 151 between the gate and the drain of the transistor M5, while including a switch 152 between the gate and the drain of the transistor M6. The circuit configuration also includes a switch 153 between the drain of the transistor M6 and the input of the amplifier stage 16, while also including a switch 154 between the drain of the transistor M5 and the input of the amplifier stage 16. The circuit configuration further includes a switch 124 between the nodes N9 and N8, while also including a switch 123 between the nodes N8 and N12.

Figure 12:
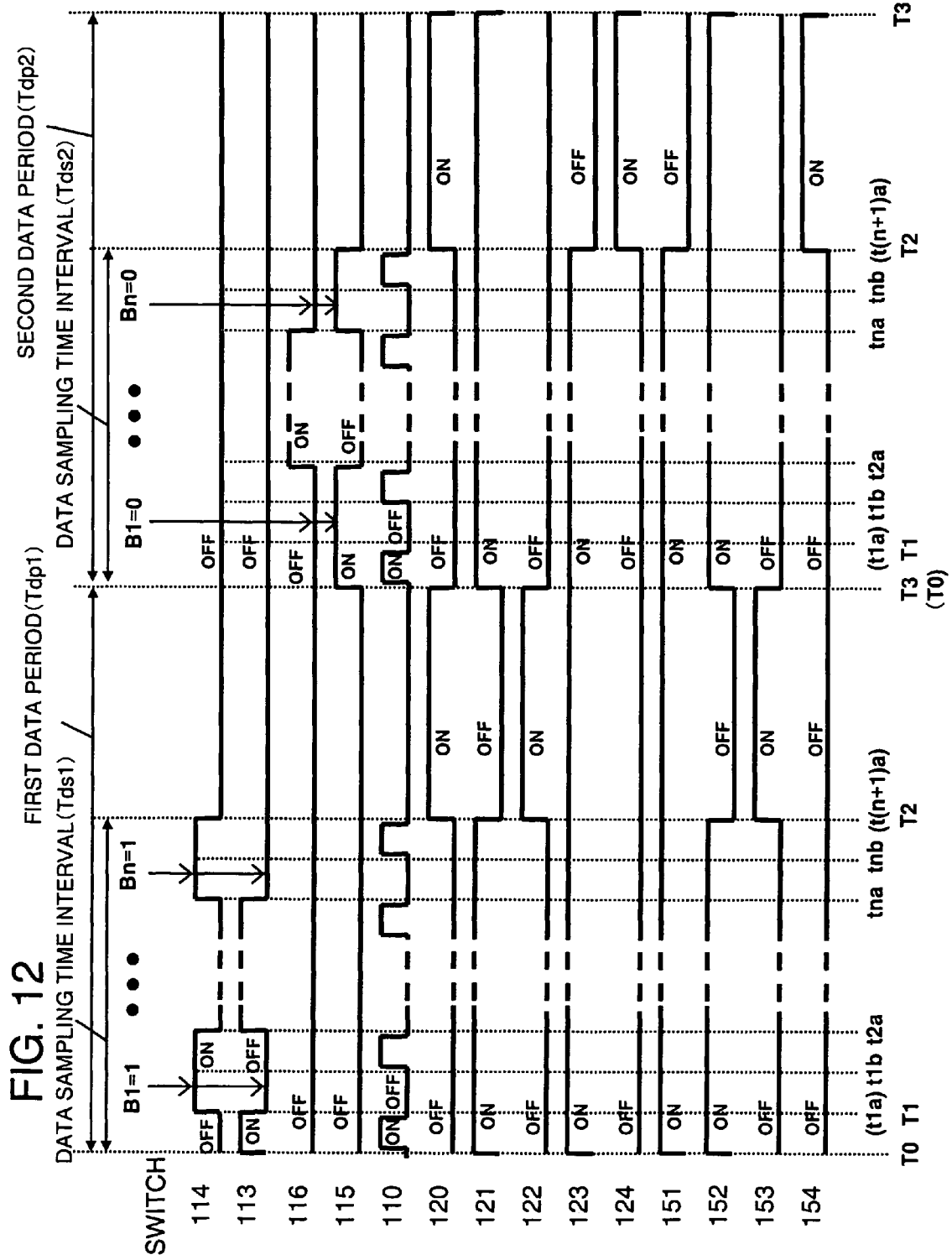
FIG. 12 is a timing chart for illustration of the operation of the exemplary embodiment 5 of the present invention.

FIG. 12 depicts a timing chart for controlling the respective switches of FIG. 11. During the first data period (Tdp1), the switch control is equivalent to that of FIG. 9 with the use of the circuit of FIG. 8. That is, the gate of the transistor M2 (node N8) becomes the non-inverting input end so that the potential corresponding to charges distributed between the capacitances (C12+Cg2) is output from the output node N9 as the output voltage Vout.

More specifically, with reference to FIG. 12, the first data time interval (Tdp1) includes a data sampling time interval T0-T2 and a driving time interval T2-T3.

In the time interval T0-T2 (data sampling time interval), the switches 121, 123, 151 and 152 are turned on, and the switches 115, 116, 120, 122, 124, 153, and 154 are turned off.

In the time interval T0-T1 (reset time interval), the switches 110 and 113 are turned on and the switch 114 is turned off, and hence the capacitances C11, C12, Cg1 and Cg2 are reset to the voltage V1.

In the time interval T1-T2, the time interval tXa-tXb and tXb-t(X+1)a are provided in each one bit date of n-bits, where X=1, 2, . . . , n). In the time interval tXa-t(X+1)a corresponding to xth bit data Bx, when the bit data Bx=0, the switch 114 is turned off and the switch 113 is turned on, and hence the capacitances C11 and Cg1 connected to the node N11 are charged to the voltage V1. When the bit data Bx=1, the switch 114 is turned on, the switch 113 is turned off, and hence the capacitances C11 and Cg1 connected to the node N11 are charged to the voltage V2.

The switch 110 is turned off, in the time interval tXa-tXb, and turned on in the time interval tXb-t(X+1)a. In the time interval tXb-t(X+1)a, the capacitance element C11 and a gate capacitance Cg1 are connected to capacitance element C12 and a gate capacitance Cg2 and the electric charge accumulated in the respective capacitances is redistributed.

At time T2 (=t(n+1)a), that is, after the operation during the time interval tXa-t(X+1)a is repeated n times for bit data B1 to Bn, each voltage level (or, electric charge corresponding to the voltage level) which is obtained by equally dividing the voltage range between the V1 and V2 by n-th power of 2 ($2^n$, where ^ indicates a power operation) is accumulated to the capacitance C12 and Cg2 that are connected to the node N8 (N12).

In the time interval T2-T3 (driving time interval), the switches 113, 114, 115, 116, 110, 121, 124, 152 and 154 are turned off, and the switches 120, 122, 151, and 153 are turned on. The differential circuit operates as a voltage follower to output the voltage at the node N8 from the output node N9 as the output voltage Vout.

During the second data period (Tdp2), the gate of the transistor M1 (node N7) becomes a non-inverting input so that the potential corresponding to charges distributed between the capacitances (C11+Cg1) is delivered from the output node N9 as output voltage Vout.

More specifically, with reference to FIG. 12, the second data time interval (Tdp2) includes a data sampling time interval T0-T2 and a driving time interval T2-T3.

In the time interval T0-T2 (data sampling time interval), the switches 121, 123, 151 and 152 are turned on, the switches 113, 114, 120, 122, 124, 153, and 154 are turned off.

In the time interval T0-T1 (reset time interval), the switches 110 and 115 are turned on, the switch 116 is turned off, and the capacitances C11, C12, Cg1 and Cg2 are reset to the voltage V1.

In the time interval tXa-t(X+1)a corresponding to xth bit data Bx, in the time interval T1-T2, when the bit data Bx=0, the switch 116 is turned off and the switch 115 is turned on, and hence the capacitances C12 and Cg2 connected to the node N12 are charged to the voltage V1. When the bit data Bx=1, the switch 116 is turned on and the switch 115 is turned off, and hence the capacitances C12 and Cg2 connected to the node N12 are charged to the voltage V2.

The switch 110 is turned off, in the time interval tXa-tXb, and turned on in the time interval tXb-t(X+1)a. In the tXb-t(X+1)a, the capacitance element C12 and a gate capacitance Cg2 are connected to the capacitance element C11 and a gate capacitance Cg1, and the electric charge accumulated in the respective capacitances is redistributed.

At time T2 (=t(n+1)a), that is, after the operation during the time interval tXa-t(X+1)a is repeated n times for bit data B1 to Bn, each voltage level (or, electric charge corresponding to the voltage level) which is obtained by equally dividing the voltage range between the V1 and V2 by n-th power of 2 ($2^n$, where ^ indicates a power operation) is accumulated to the capacitance C11 and Cg12 that are connected to the node N7 (N11).

In the time interval T2-T3 (driving time interval), the switches 113, 114, 115, 116, 110, 121, 124, 152 and 154 are turned off, and the switches 120, 122, 151, and 153 are turned on. The differential circuit operates as a voltage follower to output the voltage at the node N7 from the output node N9 as the output voltage Vout.

By switching between the first data period (Tdp1) and the second data period (Tdp2) at a preset period, variations in characteristics of the differential pair (M1, M2) or those of the capacitance elements C11 and C12 may be time averaged, thus effectively reducing the output offset.

Exemplary Embodiment 6

FIG. 13 shows a configuration of an exemplary embodiment 6 of the present invention, more specifically, an example configuration of a multi-output DAC. Referring to FIG. 13, the multi-output DAC of the present exemplary embodiment includes a reference voltage generating circuit 210, a decoder 220 and an output circuit 230. The reference voltage generating circuit 210 generates reference voltages Vr1, Vr2, . . . , VrS, based on the reference voltages V1 and V2. The decoder 220 inputs the respective reference voltages and selects two reference voltages (Vin1, Vin2), inclusive of duplications, based on digital data B1 to Bn associated with each output, to deliver the so selected two reference voltages as outputs. The output circuit 230 inputs the two reference voltages (Vin1, Vin2) to operate in accordance with a switch controlling signal. In the present Example, the output circuit 230 may be that shown in any of FIGS. 3, 5 and 6.

Exemplary Embodiment 7

FIG. 14 depicts a configuration of an exemplary embodiment 7 of the present invention and, more specifically, shows another example configuration of a multi-output DAC. Referring to FIG. 14, the multi-output DAC of the present exemplary embodiment is composed by an output circuit 330 that operates in response to switch control signals based on reference voltages V1 and V2 and digital data B1 to Bn serially entered in association with each output. The output circuit 330 may be that shown in any of FIGS. 8, 10 and 11.

In the above exemplary embodiments, the n-channel differential pair M1 and M2 is used as the differential pair for the sake of explanation. It is of course possible to constitute the differential pair by p-channel MOS transistors, in which case the polarities of the respective transistors need to be reversed from those with the circuit of FIG. 1.

The disclosure of the aforementioned Patent Document is incorporated by reference herein. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claim and the technical concept of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A sample and hold circuit comprising:

first and second capacitance elements, each of the first and second capacitance elements having first and second terminals, at least one of the first terminals of the first and second capacitance elements being supplied with a voltage to be sampled, the second terminals of the first and second capacitance elements being coupled together and connected to a node supplied with a reference voltage;

a first switch connected between respective ones of the first terminals of the first and second capacitance elements; and a differential circuit, wherein the differential circuit includes:

a differential input stage having first and second inputs, the second input of the differential input stage being connected to the first terminal of the second capacitance element;

a second switch connected between the first input of the differential input stage and the first terminal of the first capacitance element;

an amplifier stage having an input at which an output signal of the differential input stage is received, the amplifier stage having an output connected to an output terminal of the sample and hold circuit; and a third switch connected between the first input of the differential input stage and the output of the amplifier stage.

2. The sample and hold circuit according to claim 1, wherein each data period has first, second and third time intervals, wherein during the first time interval, in which the first and third switches are turned off and the second switch is turned on, the voltage to be sampled is applied to at least one of the first terminals of the first and second capacitance elements, during the second time interval, in which the second and third switches are turned on and off respectively and the first switch is turned on, re-distribution of electric charge between the first and second capacitance elements is made, and during the third time interval, in which the first and second switches turned off, and the third switch turned on, an output signal of the differential circuit that differentially amplifies the voltages at the first and second inputs is output at the output terminal.

3. A serial digital-to-analog converter circuit comprising the sample and hold circuit according to claim 2, wherein following a preset resetting time interval, the first time interval and the second time interval are allocated to each 1-bit data of an n-bit digital signal that is serially input, where n is a preset positive integer;

during the first time interval, one of binary-level voltages corresponding to each bit data of the input digital signal, as the voltage to be sampled, is supplied to the first terminal of at least one of the first and second capacitance elements, during the second time interval, electric charge are re-distributed between the first and second capacitance elements, and the first and second time intervals are repeated n times in a corresponding relationship to an n-number of bit data of the digital signal that is serially input, after which an amplification operation by the differential circuit during the third period is performed.

4. The sample and hold circuit according to claim 1, wherein the differential input stage including:

first and second current sources having first terminals connected to the first power supply terminal;

a first MOS transistor having a gate terminal connected to the first terminal of the first capacitance element via the second switch and connected via the third switch to the output terminal of the sample and hold circuit, the gate terminal of the first MOS transistor forming the first input of the differential input stage, the first MOS transistor having a source terminal connected to a second terminal of the first current source;

a second MOS transistor having a gate terminal connected to the first terminal of the second capacitance element and having a source terminal connected to a second terminal of the second current source and connected to the source of the first MOS transistor via the fourth switch, the gate terminal of the second MOS transistor forming the second input of the differential input stage; and a load circuit connected between the drain terminals of the first and second MOS transistors and a second power supply terminal.

5. The sample and hold circuit according to claim 4, wherein each data period has first, second and third time intervals, wherein during the first time interval, in which the first, third and fourth switches are turned off and the second switch is turned on, the voltage to be sampled is applied at least to the first terminal of the first capacitance element and to the first input of the differential input stage, during the second time interval, in which the second, third and fourth switches are turned on, off and off, respectively, and the first switch is turned on, re-distribution of electric charge between the first and second capacitance elements is made, and during the third time interval, in which the first and second switches are turned off and the third and fourth switches are turned on, an amplified result by the differential circuit that differentially amplifies the voltages at the first and second inputs is output at the output terminal.

6. The sample and hold circuit according to claim 4, further comprising a voltage supply circuit that delivers the voltage to be sampled to the first terminal of at least one of the first and second capacitance elements.

7. The sample and hold circuit according to claim 6, wherein the voltage supply circuit includes a switch between a voltage supply terminal and the first terminal of at least one of the first and second capacitance elements.

8. The sample and hold circuit according to claim 7, wherein the load circuit includes:

a third MOS transistor having a source terminal connected to the second power supply terminal and having a drain terminal connected to a drain terminal of the first MOS transistor, the third MOS transistor having the gate and drain terminals connected together;

a fourth MOS transistor having a source terminal connected to the second power supply terminal and having a drain terminal connected to a drain terminal of the second MOS transistor;

a fifth switch connected between a connection node of the drain terminals of the second and fourth MOS transistors and an input of the amplifier stage; and a sixth switch connected between the gate and drain terminals of the fourth MOS transistor.

9. The sample and hold circuit according to claim 8, wherein each data period has first, second and third time intervals;

during the first time interval, in which the switch in the voltage supply circuit is turned on, the first, third, fourth and fifth switches are turned off, the sixth switch and the second switch are turned on, the voltage to be sampled is applied at least to the first terminal of the first capacitance element and to the first input of the differential input stage, during the second time interval, in which the switch in the voltage supply circuit is turned off, the third, fourth and fifth switches are turned off, the sixth switch and the second switch are turned on, the first switch is turned on, re-distribution of electric charge between the first and second capacitance elements is made, and during the third time interval, in which the switch in the voltage supply circuit is turned off, the first, second and sixth switches are turned off, and the third, fourth and fifth switches are turned on, an amplified result of the differential circuit that differentially amplifies the voltages at the first and second inputs is output at the output terminal.

10. The sample and hold circuit according to claim 6, wherein the voltage supply circuit includes:

a first voltage supply circuit and a second voltage supply circuit, the first voltage supply circuit including:

a seventh switch connected between a first voltage supply terminal supplied with a first voltage to be sampled and the first terminal of the first capacitance element, the second voltage supply circuit including:

a eighth switch connected between a second voltage supply terminal supplied with second voltage to be sampled and the first terminal of the second capacitance element.

11. A digital-to-analog converter comprising:

a reference voltage generator that generates a plurality of different reference voltages;

a decoder that receives the plurality of reference voltages to select and output first and second reference voltages, based on digital data associated with each output; and an output circuit that receives the first and second reference voltages as the first and second voltages to be sampled and that operates in response to a switch control signal supplied thereto, the output circuit including the sample and hold circuit according to claim 10.

12. The sample and hold circuit according to claim 6, wherein the voltage supply circuit includes:

a first voltage supply circuit and a second voltage supply circuit, the first voltage supply circuit including:

a seventh switch connected between a first voltage supply terminal and the first terminal of the first capacitance element; and an eighth switch connected between the first voltage supply terminal and the first terminal of the second capacitance element;

the second voltage supply circuit including:

a ninth switch connected between a second voltage supply terminal and the first terminal of the second capacitance element; and a tenth switch connected between the second voltage supply terminal and the first terminal of the first capacitance element, the seventh and ninth switches being turned on and off in common, while the eight and tenth switches being turned on and off in common.

13. The sample and hold circuit according to claim 12, wherein the load circuit includes:

third and fourth MOS transistors having source terminals connected to the terminal of the second power supply, having gate terminals connected together and having drain terminals connected to drain terminals of the first and second MOS transistors;

an eleventh switch connected between the gate and drain terminals of the third MOS transistor;

a twelfth switch connected between the gate and drain terminals of the fourth MOS transistor;

a thirteenth switch connected between a connection node of the drain terminals of the second and fourth MOS transistors and an input terminal of the amplifier stage;

a fourteenth switch connected between a connection node of the drain terminals of the first and third MOS transistors and an input terminal of the amplifier stage;

a fifteenth switch connected between the output terminal and a gate terminal of the second MOS transistor; and a sixteenth switch between the gate terminal of the second MOS transistor and the first terminal of the second capacitance element.

14. The sample and hold circuit according to claim 13, wherein each data period has first, second and third time intervals, wherein during the first time interval of a first data period, in which the second, seventh, ninth, eleventh, twelfth and sixteenth switches are turned on, the first, third, fourth, eighth, tenth and thirteenth to fifteenth switches are turned off, a first voltage to be sampled at the first voltage supply terminal is applied to the first terminal of the first capacitance element and to the first input of the differential input stage, and a second voltage to be sampled at the second voltage supply terminal is applied to the first terminal of the second capacitance element and to the second input of the differential input stage, during the second time interval of the first data period, in which the seventh and ninth switches are turned off, the second, eleventh, twelfth, and sixteenth switches are turned on, and the third, fourth, eighth, tenth, thirteenth, fourteenth, fifteenth switches are turned off, and the first switch is turned on, re-distribution of electric charge between the first and second capacitance elements is made, during the third time interval of the first data period, in which the first, second, seventh to tenth, twelfth, fourteenth and fifteenth switches are turned off, and the third, fourth, eleventh, thirteenth and sixteenth switches are turned on, the amplified result by the differential circuit that differentially amplifies the voltages at the first and second inputs is output at the output terminal, during the first time interval of a second data period, in which the second, eighth, tenth, eleventh, twelfth and sixteenth switches are turned on and the first, third, fourth, seventh, ninth, thirteenth, fourteenth and fifteenth switches are turned off, the second voltage to be sampled at the second voltage supply terminal is delivered to the first terminal of the first capacitance element and to the first input of the differential input stage, and the first voltage to be sampled at the first voltage supply terminal is delivered to the first terminal of the second capacitance element and to the second input of the differential input stage;

during the second time interval of the second data period, in which the eighth and tenth switches are turned off, the second, eleventh, twelfth, and sixteenth switches are turned on, the third, fourth, seventh, ninth, thirteenth, fourteenth, fifteenth switches are turned off, and the first switch is turned on, re-distribution of electric charge between the first and second capacitance elements is made, and during the next third time interval of the second data period, in which the first, third, seventh to eleventh, thirteenth and sixteenth switches are turned off and the second, fourth, twelfth, fourteenth and fifteenth switches are turned on, the amplified result by the differential circuit that differentially amplifies the voltages at the first and second inputs is output at the output terminal.

15. The sample and hold circuit according to claim 6, wherein the voltage supply circuit includes:

a seventeenth switch connected between the terminal of the first voltage supply and at least one of the first terminals of the first and second capacitance elements; and an eighteenth switch connected between the terminal of the second voltage supply and one of the first terminals of the first and second capacitance elements, wherein the seventeenth and eighteenth switches are complementarily turned on or off in response to respective bit data of an input digital signal.

16. The sample and hold circuit according to claim 6, wherein the voltage supply circuit includes:

a first voltage supply circuit and a second voltage supply circuit, wherein the first voltage supply circuit includes:
a seventeenth switch connected between the terminal of the first voltage supply and the first terminal of the first capacitance element; and
an eighteenth switch connected between the terminal of the second voltage supply and the first terminal of the first capacitance element, and wherein
the second voltage supply circuit includes:
a nineteenth switch connected between the terminal of the first voltage supply and the first terminal of the second capacitance element; and
a twentieth switch connected between the terminal of the second voltage supply terminal and the first terminal of the second capacitance element;
the seventeenth and eighteenth switches being complementarily turned on or off in response to respective bit data of the input digital signal,
the nineteenth and twentieth switches being complementarily turned on or off in response to respective bit data of the input digital signal.

17. The sample and hold circuit according to claim 1, further comprising
a fifth switch that controls on and off of the connection between an output of the differential input stage and an input of the amplifier stage.

18. The sample and hold circuit according to claim 1, wherein the differential circuit includes:
a circuit that switches between a first connection state in which the first input and the second input of the differential input stage are respectively set to an inverting input and a non-inverting input and a second connection state in which the second input and the first input of the differential input stage are respectively set to an inverting input and a non-inverting input;
a fifth switch connected between the output terminal of the sample and hold circuit and the second input of the differential input stage; and
a sixth switch connected between the second input of the differential input stage and the first terminal of the second capacitance element.

19. A serial digital-to-analog converter circuit comprising the sample and hold circuit according to claim 1, wherein one of binary-level voltages, as the voltage to be sampled, is sequentially delivered to the first terminal of at least one of the first and second capacitance elements in response to the value of each bit data of an input digital signal that is serially input.

20. A display device including a digital-to-analog converter circuit according to claim 19 as a data driver.

* * * * *